United States Patent
Ho et al.

(10) Patent No.: US 9,583,362 B2
(45) Date of Patent: Feb. 28, 2017

(54) METAL GATE STRUCTURE AND MANUFACTURING METHOD THEREOF

(71) Applicant: TAIWAN SEMICONDUCTOR MANUFACTURING COMPANY LTD., Hsinchu (TW)

(72) Inventors: Wei-Shuo Ho, New Taipei (TW); Tsung-Yu Chiang, New Taipei (TW); Kuang-Hsin Chen, Jung-Li (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 14/158,572

(22) Filed: Jan. 17, 2014

(65) Prior Publication Data
US 2015/0206963 A1    Jul. 23, 2015

(51) Int. Cl.
*H01L 21/00* (2006.01)
*H01L 29/00* (2006.01)
(Continued)

(52) U.S. Cl.
CPC ..... *H01L 21/3215* (2013.01); *H01L 21/28088* (2013.01); *H01L 21/31111* (2013.01);
(Continued)

(58) Field of Classification Search
CPC .................. H01L 21/823842; H01L 21/31111; H01L 21/3215; H01L 21/31116; H01L 29/517; H01L 29/78; H01L 29/4238; H01L 29/66613; H01L 29/4326
(Continued)

(56) References Cited

U.S. PATENT DOCUMENTS 7,682,891 B2 * 3/2010 Lavoie ........... H01L 21/823842
                                                        257/E29.255
7,759,239 B1 * 7/2010 Lin et al. ................ 438/592
(Continued)

FOREIGN PATENT DOCUMENTS

TW    200812079 A    3/2008
TW    201237946 A    9/2012
TW    201318041 A    5/2013

OTHER PUBLICATIONS

Taiwan Office Action issued by Taiwan Intellectual Property Office on Sep. 14, 2015.
(Continued)

*Primary Examiner* — Nikolay Yushin
(74) *Attorney, Agent, or Firm* — Chun-Ming Shih

(57) ABSTRACT

The present disclosure provides a semiconductor structure includes a semiconductor layer having a first surface, and an interlayer dielectric (ILD) defining a metal gate over the first surface of the semiconductor layer. The metal gate includes a high-k dielectric layer, a barrier layer, and a work function metal layer. A thickness of a first portion of the barrier layer at the sidewall of the metal gate is substantially thinner than a thickness of the barrier layer at the bottom of the metal gate. The present disclosure provides a method for manufacturing a semiconductor structure. The method includes forming a metal gate trench in an ILD, forming a barrier layer in a bottom and a sidewall of the metal gate trench, removing a first portion of the barrier layer at the sidewall of the metal gate trench, and forming a work function metal layer conforming to the barrier layer.

19 Claims, 18 Drawing Sheets

(51) Int. Cl.
H01L 21/3215 (2006.01)
H01L 21/311 (2006.01)
H01L 21/28 (2006.01)
H01L 29/49 (2006.01)
H01L 29/66 (2006.01)
H01L 21/3213 (2006.01)
H01L 29/51 (2006.01)

(52) U.S. Cl.
CPC .. *H01L 21/31116* (2013.01); *H01L 21/32134* (2013.01); *H01L 21/32136* (2013.01); *H01L 21/32139* (2013.01); *H01L 29/4966* (2013.01); *H01L 29/66545* (2013.01); *H01L 29/513* (2013.01); *H01L 29/517* (2013.01)

(58) Field of Classification Search
USPC ........ 257/411, 410, 369, 407; 438/691, 199, 438/585
See application file for complete search history.

(56) References Cited

U.S. PATENT DOCUMENTS

| | | | |
|---|---|---|---|
| 8,193,641 B2* | 6/2012 | Rachmady et al. | 257/758 |
| 8,609,484 B2* | 12/2013 | Tao et al. | 438/211 |
| 8,669,155 B2* | 3/2014 | Yin et al. | 438/229 |
| 8,669,618 B2* | 3/2014 | Fu et al. | 257/368 |
| 8,815,728 B2* | 8/2014 | Jiang | H01L 29/401 |
| | | | 257/E21.643 |
| 8,853,068 B2* | 10/2014 | Hsu et al. | 438/592 |
| 9,012,319 B1* | 4/2015 | Choi | H01L 21/28158 |
| | | | 438/591 |
| 2006/0267113 A1* | 11/2006 | Tobin | H01L 21/28194 |
| | | | 257/408 |
| 2007/0262451 A1* | 11/2007 | Rachmady et al. | 257/758 |
| 2011/0108928 A1* | 5/2011 | Tao et al. | 257/410 |
| 2011/0127590 A1* | 6/2011 | Binder et al. | 257/288 |
| 2012/0056267 A1* | 3/2012 | Yin et al. | 257/369 |
| 2012/0086085 A1* | 4/2012 | Hsu et al. | 257/369 |
| 2013/0105919 A1* | 5/2013 | Jiang | H01L 29/401 |
| | | | 257/411 |
| 2013/0154012 A1 | 6/2013 | Fu et al. | |
| 2015/0145057 A1* | 5/2015 | Fan | H01L 27/092 |
| | | | 257/369 |

OTHER PUBLICATIONS

Office action No. 9-5-2015-086620633 issued by Korean Intellectual Property Office on Dec. 10, 2015.

* cited by examiner

METAL GATE STRUCTURE AND MANUFACTURING METHOD THEREOF

FIELD

The disclosure relates to a metal gate in a semiconductor structure.

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC processing and manufacturing are needed. As the dimensions of transistors decrease, the thickness of the gate oxide must be reduced to maintain performance with the decreased gate length. However, in order to reduce gate leakage, high dielectric constant (high-k) gate insulator layers are used which allow greater physical thicknesses while maintaining the same effective capacitance as would be provided by a typical gate oxide used in larger technology nodes.

Additionally, as technology nodes shrink, in some IC designs, there has been a desire to replace the typically polysilicon gate electrode with a metal gate (MG) electrode to improve device performance with the decreased feature sizes. One process of forming the MG electrode is termed "gate last" process, as opposed to another MG electrode formation process termed "gate first". The "gate last" process allows for reduced number of subsequent processes, including high temperature processing, that must be performed after formation of the gate.

Thus, what is desired is a method and semiconductor device providing differently configured metal gate structures for each NFET and PFET formed on a substrate.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION OF THE INVENTION

Figure 1:
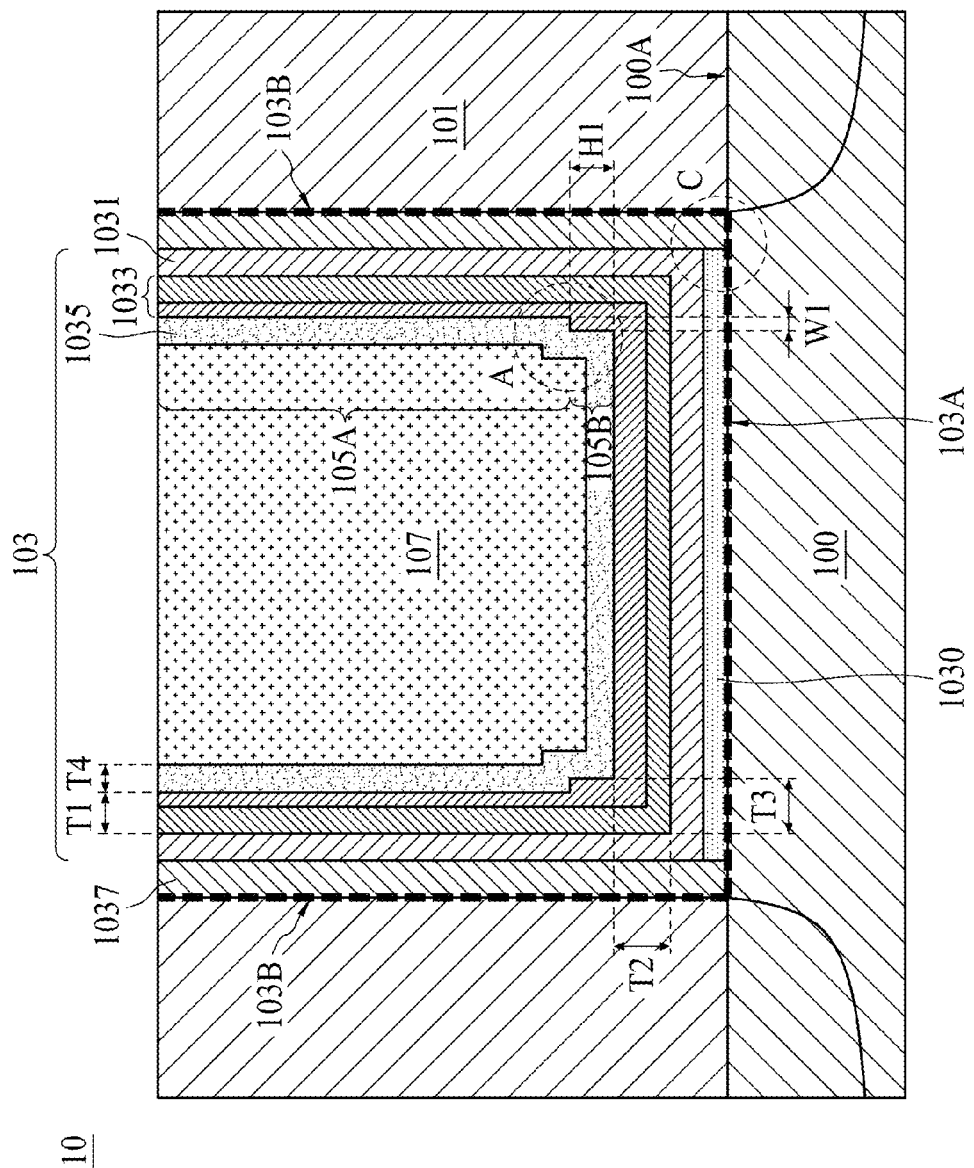
FIG. 1 is a cross sectional view of a semiconductor structure with a metal gate in accordance with some embodiments of the present disclosure.

In the following detailed description, numerous specific details are set forth in order to provide a thorough understanding of the invention. However, it will be understood by those skilled in the art that the present invention may be practiced without these specific details. In other instances, well-known methods, procedures, components and circuits have not been described in detail so as not to obscure the present invention. It is to be understood that the following disclosure provides many different embodiments or examples for implementing different features of various embodiments. Specific examples of components and arrangements are described below to simplify the present disclosure. These are, of course, merely examples and are not intended to be limiting.

The making and using of the embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Aluminum implantation is used to reduce the flatband voltage ($V_{FB}$) and the effective work function of a metal gate (MG) structure close to a channel region of a transistor.

Metal elements such as aluminum have been used as a prominent vehicle to adjust a threshold voltage of an N-type transistor given its ability to attract negative carriers in the channel region of the N-type transistor and hence lower the threshold voltage. In a MG structure, the aluminum ions are implanted into an N-work function metal layer that allows the aluminum atoms to diffuse toward the underlying barrier layer or dielectric layer positioned closer to the channel region of the N-type transistor.

As previously discussed, the aluminum atoms reduce the threshold voltage of the N-type transistor under the condition that the channel length (i.e. distance between a source region and a drain region underneath a metal gate structure) is long enough, for example, more than 40 nm. However, as the channel length scales down according to Moore's law, weak corner turn on (WCTO) effect becomes a problem preventing the threshold voltage from decreasing. Because a distance between an N-work function metal layer and a bottom corner of the metal gate is substantially greater than a distance between an N-work function metal layer and a center bottom of the metal gate, the barrier layer or dielectric layer proximal to the bottom corner of the metal gate receives fewer aluminum atoms compared to the barrier layer or dielectric layer proximal to the center bottom of the metal gate. Hence, the threshold voltage close to the bottom corner of the metal gate cannot be reduced to the same extent as the threshold voltage close to the center bottom of the metal gate does.

The WCTO effect is especially severe in a short channel length metal gate because the bottom corner portion weighs more in the short channel length metal gate than that in the long channel length metal gate. It is shown that given the same aluminum concentration in the N-work function metal layer, the measured threshold voltage increases when the channel length decreases. The WCTO effect can be observed when metal gates with a mix of channel lengths are manufactured together on a same wafer. The same aluminum concentration is implanted or deposited into the N-work function metal layer but the result shows a lower threshold voltage in a transistor with a longer channel length while a higher threshold voltage in a transistor with a shorter channel length.

Some embodiments of the present disclosure provide a semiconductor structure with a metal gate. An N-work function metal layer in the metal gate is conformal to an engineered underlying barrier layer in a way to allow more aluminum atoms to diffuse to the bottom corner of the metal gate, and hence resolving the problems caused by the WCTO effect.

Some embodiments of the present disclosure provide a method for manufacturing a semiconductor structure with a metal gate having an N-work function metal layer, conforming to an engineered underlying barrier layer in a way to allow more aluminum atoms to diffuse to the bottom corner of the metal gate.

FIG. 1 shows a cross sectional view of a semiconductor structure 10 with a metal gate 103. The semiconductor structure 10 has a semiconductor layer 100, where the metal gate 103 and an interlayer dielectric layer (ILD) 101 defining and surrounding the metal gate 103 are positioned over. The semiconductor layer 100 has a first surface 100A that is proximal to a channel region of a transistor. The metal gate 103 and the ILD 101 are positioned over the first surface 100A of the semiconductor layer 100. In some embodiments, the semiconductor layer 100 referred herein is a bulk semiconductor substrate on which various layers and device structure are formed. In some embodiments, the bulk substrate includes silicon or a compound semiconductor, such as GaAs, InP, Si/Ge, or SiC. Various layers can be formed on the semiconductor layer 100. For example, dielectric layers, doped layers, polysilicon layers or conductive layers. Various devices can be formed on the semiconductor layer 100. For example, transistors, resistors, and/or capacitors, which may be interconnected through an interconnect layer to additional integrated circuits.

In some embodiments, the semiconductor structure 10 can be a planar or a non-planar transistor structure. For example, a MOSFET or a FinFET structure possessing various features in the semiconductor layer 100. The various features include, but not limited to, lightly doped source/drain regions (n-type and p-type LDD), source/drain (S/D) regions, silicide features, contact etch stop layer (CESL). It should be noted that strained structures in the semiconductor layer 100, such as silicon germanium (SiGe) and silicon carbide (SiC) stressors may be formed in the P-type and/or N-type transistor, respectively.

Referring to FIG. 1, the metal gate 103 is surrounded by the ILD 101 at a sidewall 103B. A bottom 103A of the metal gate 103 is positioned over the semiconductor layer 100. In some embodiments, the metal gate 103 referred herein includes an optional interlayer 1030 between a horizontal portion of the high-k dielectric layer 1031 and the semiconductor layer 100. In some embodiments, the metal gate 103 referred herein includes an optional sidewall spacer 1037 contacting a vertical portion of the high-k dielectric layer 1031.

In FIG. 1, the metal gate 103 includes a high-k dielectric layer 1031, a barrier layer 1033 formed at an open surface of the high-k dielectric layer 1031, conforming to the surface contour of the high-k dielectric layer 1031, and a work function metal layer 1035 conforming to the surface contour of the barrier layer 1033. The high-k dielectric layer 1031 in semiconductor structure 10 conforms to a bottom 103A and a sidewall 103B of the metal gate 130. At the sidewall 103B of the metal gate 103, the barrier layer 1033 has a first portion 105A with a thickness T1 and a second portion 105B with a thickness T3. At the bottom 103A of the metal gate 103, the barrier layer 1033 has a thickness T2. In some embodiments, the thickness T2 at the bottom 103A of the metal gate 103 is greater than the thickness T1 of the first portion 105A of the barrier layer 1033. However, in some embodiments, the thickness T2 at the bottom 103A of the metal gate 103 is greater than both the thicknesses T1 of the first portion 105A and the thickness T3 of the second portion 105B of the barrier layer 1033. In some embodiments, the thickness T4 of the work function metal layer 1035 is in a range of from about 1 Å to about 20 Å.

In FIG. 1, the barrier layer 1033 of the metal gate 103 has a first portion 105A with a thickness T1 and a second portion 105B with a thickness T3 that is greater than the thickness T1 of the first portion 105A. Accordingly, the work function metal layer 1035 in contact with the first portion 105A of the barrier layer 1033 is closer to the sidewall 103B of the metal gate 103 than the work function metal layer 1035 in contact with the second portion 105B of the barrier layer 1033. Hence, a joint A connecting the work function metal layer 1035 that is conforming to the first portion 105A and the second portion 105B is closer to a bottom corner C of the metal gate 103 compared to the condition where the thicknesses T1 of the first portion and the thickness T3 of the second portion are identical (not shown).

In some embodiments, the ILD 101 includes a dielectric material. In some embodiments, the dielectric material includes silicon oxide, silicon nitride, silicon oxynitride, spin-on glass (SOG), fluorinated silica glass (FSG), carbon doped silicon oxide (e.g., SiCOH), BLACK DIAMOND® (Applied Materials of Santa Clara, Calif.), XEROGEL®, AEROGEL®, amorphous fluorinated carbon, Parylene, BCB (bis-benzocyclobutenes), FLARE®, SILK® (Dow Chemical, Midland, Mich.), polyimide, other proper porous polymeric materials, other suitable dielectric materials, and/or combinations thereof. In some embodiments, the ILD 101 includes a high density plasma (HDP) dielectric material (e.g., HDP oxide) and/or a high aspect ratio process (HARP) dielectric material (e.g., HARP oxide). It is understood that the ILD 101 may include one or more dielectric materials and/or one or more dielectric layers. The ILD 101 is planarized by a chemical-mechanical-polishing (CMP) process until a top portion of the metal gate 103 is exposed as illustrated in FIG. 1. The CMP process includes a high selectivity to provide a substantially planar surface for the metal gate 103, optional sidewall spacers 1037, and ILD 101. In some embodiments, the CMP process has low dishing and/or metal erosion effect.

In some embodiments of the present disclosure, the high-k dielectric layer 1031 is formed by ALD, CVD, metalorganic CVD (MOCVD), PVD, plasma enhanced CVD (PECVD), plasma enhance ALD (PEALD), thermal oxidation, combinations thereof, or other suitable technique. In some embodiments, the high-k dielectric layer 1031 includes a thickness ranging from about 5 to about 30 Å. The high-k dielectric layer 1031 includes a binary or ternary high-k film. In some embodiments, the high-k dielectric layer 1031 includes LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides, or other suitable materials.

In some embodiments, the barrier layer 1033 includes metal nitrides such as TiN, TaN, or metal carbonitride such as titanium carbonitride or other quaternary layer which has a general formula $(M_1, M_2)$ $(C, N)$, wherein $M_1$ and $M_2$ are different metals of IVa or Va group. In some embodiments, the barrier layer 1033 has a thickness ranging from about 2 to about 40 Å. The barrier layer 1033 functions as a barrier to protect the high-k dielectric layer 1031. The barrier layer 1033 is formed by various deposition techniques such as ALD, PVD, CVD, PECVD, or other suitable technique. In some embodiments as shown in FIG. 1, the barrier layer 1033 is a bilayer that includes two layers of materials. For example, one of the barrier layers proximal to the high-k dielectric layer 1031 is made of metal nitrides or metal carbonitride of a first composition, whereas the other barrier layer proximal to the work function metal layer 1035 is made of metal nitrides or metal carbonitride of a second composition. For example, the materials composing the bilayer can be identical but for the relative atomic concentration of the compound. For example, the materials composing the bilayer can be different. For example, the materials composing the bilayer can be identical but are formed by different deposition operations. In some embodiments, the barrier layer proximal to the work function metal layer 1035 is called a capping layer. In some embodiments, a thickness of the barrier layers proximal to the high-k dielectric layer 1031 is of about from 1 to about 20 Å, and a thickness of the barrier layers proximal to the work function metal layer 1035 is of about from 1 to about 20 Å.

In some embodiments, the work function metal layer 1035 includes metal carbonitride such as TiN, metal silicon nitride such as TiSiN, or metal aluminide. In some embodiments when the work function metal layer 1035 is made of metal carbonitride or metal silicon nitride, aluminum atoms are further introduced into the work function metal layer 1035 through an implantation operation after the deposition of the work function metal layer 1035. In other embodiments, the work function metal layer 1035 includes TiAlN, TiAl, or TaAl. The work function metal layer 1035 can be deposited through various deposition techniques such as ALD, PVD, CVD, PECVD, or other suitable technique. In some embodiments, a thickness of the work function metal layer 1035 is within a range of from about 1 Å to about 20 Å.

In some embodiments, a gate fill metal 107 is disposed in the metal gate 103. The gate fill metal 103 includes metals having a stand alone work function that is between 4.2 top 4.8 eV. In some embodiments, the gate fill metal includes W, Al, Co, and the alloys thereof. In an embodiment of the present disclosure, a thickness of the gate fill metal 107 is between 500 to 3000 Å, which is around 5 to 30 times thicker than the total thickness of the work function metal layer 1035 and the barrier layer 1033.

Referring to FIG. 1, a stair profile can be observed at a portion of the barrier layer proximal to the bottom corner C of the metal gate 103. As shown in FIG. 1, the stair profile includes two surfaces perpendicularly disposed. A vertical portion of the stair profile has a height H1, which is defined as a distance between a top surface of the barrier layer deposited at the bottom of the metal gate 103 to a horizontal portion of the stair profile. In some embodiments, the height H1 of the vertical portion of the stair profile is more than 2Å. In some embodiments, a width W1 of the horizontal portion of the stair profile is less than an original thickness of the barrier layer 1033. For example, an original thickness of the barrier layer 1033 can be defined as a thickness T3 at the bottom of the metal gate 103. In FIG. 1, because the work function metal layer 1035 is conforming to the underlying barrier layer 1033, the stair profile is hence transferred to the work function metal layer 1035 and a stair profile delineated by the work function metal layer 1035 can be observed.

As shown in the semiconductor structure 10 in FIG. 1, an engineered barrier layer 1033 includes a stair profile and thus the portion of the work function metal layer 1035 proximal to the first portion 105A of the barrier layer 1033 is closer to the bottom corner C of the metal gate 103 compared to the case where the barrier layer 1033 does not possess a stair profile. When a first portion 105A and a second portion 105B of the barrier layer can be distinguished by the thickness thereof, a portion of the work function metal layer 1035 generates a horizontal shift toward a direction perpendicular to the sidewall 103B. The horizontal shift transfers the work function metal layer 1035 to a position closer to the bottom corner C of the of the metal gate 103. In some embodiments, the distance of the horizontal shift is about the width W1 of the horizontal portion of the stair profile. The aluminum atoms in the work function metal layer 1035 can more effectively arrive at the underlying barrier layer 1033 or high-k dielectric layer 1031 positioned closer to the two ends of a channel region of an N-type transistor when the barrier layer 1033 is engineered to possess a stair profile.

Figure 2:
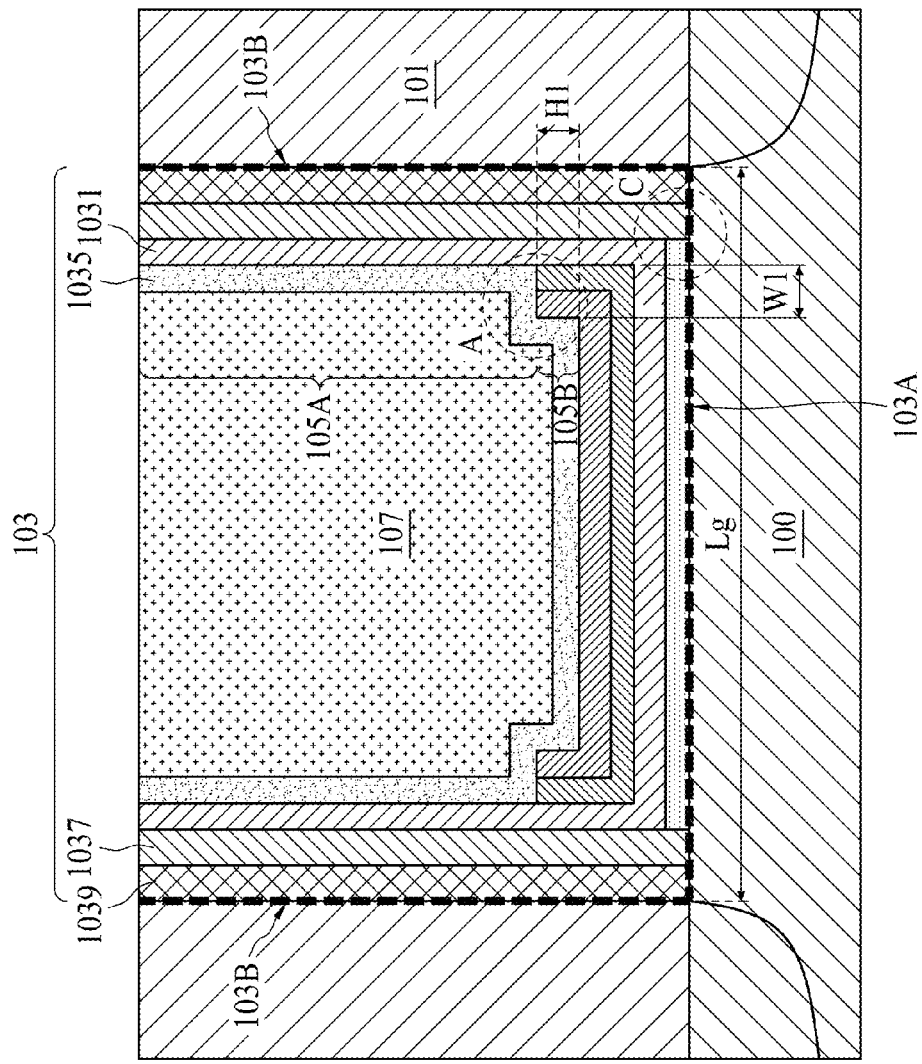
FIG. 2 is a cross sectional view of a semiconductor structure with a metal gate in accordance with some embodiments of the present disclosure.

FIG. 2 shows a cross sectional view of a semiconductor structure 20 with a metal gate 103. Elements with the same numeral labels in FIG. 1 are directed to the same structure or materials, and are not repeated here for simplicity. Compared to FIG. 1, the thickness T1 of the first portion 105A of the barrier layer 1033 in FIG. 2 is zero. In other words, the barrier layer 1033 remains only at the bottom 103A and at the second portion 105B of the sidewall 103B of the metal gate 103. FIG. 2 shows a stair profile at the joint A, and the width W1 of the horizontal portion of the stair profile is about the original thickness T2 of the barrier layer 1033.

In FIG. 2, a horizontal shift of the work function metal layer 1035 is greater than the horizontal shift of the work function metal layer 1035 shown in FIG. 1, where the barrier layer 1033 is only thinned at the first portion 105A instead of totally removed as shown in the semiconductor structure 20 in FIG. 2. Compared to FIG. 1, because the greater horizontal shift of the work function metal layer 1035, the aluminum atoms in the work function metal layer 1035 can more effectively arrive at the underlying barrier layer 1033 or a high-k dielectric layer 1031 positioned closer to the two ends of a channel region of an N-type transistor when the barrier layer 1033 is engineered to possess a stair profile. In addition, the metal gate 103 of the semiconductor structure 20 further includes an optional nitride layer 1039 surrounding the sidewall spacer 1037.

In some embodiments, the semiconductor structure 20 is a planar N-MOSFET with a channel length $L_g$ of from about 20 to about 40 nm. In other embodiments, the semiconductor structure 20 is a nonplanar N-FinFET with a channel length $L_g$ of from about 10 to about 20 nm.

Figure 3:
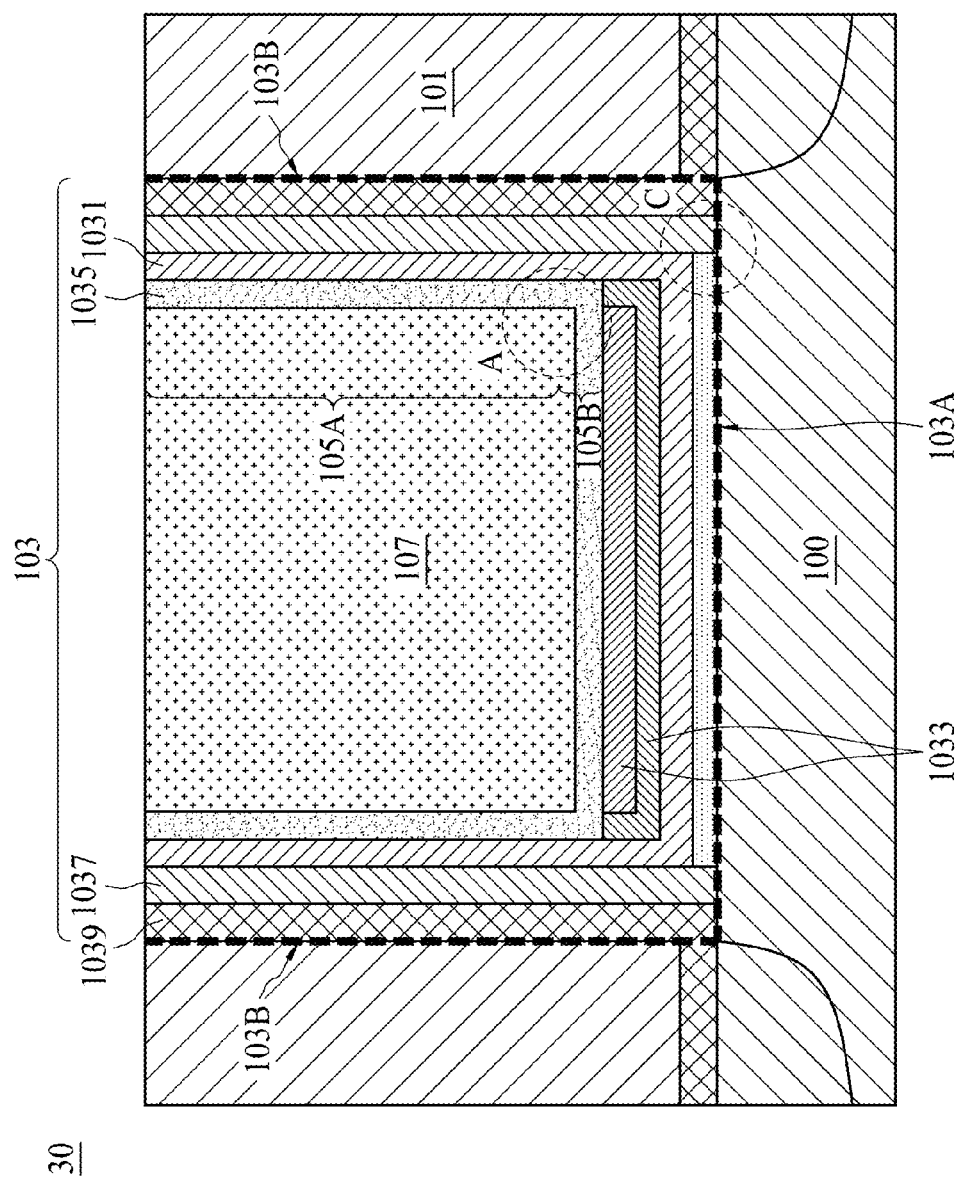
FIG. 3 is a cross sectional view of a semiconductor structure with a metal gate in accordance with some embodiments of the present disclosure.

FIG. 3 shows a cross sectional view of a semiconductor structure 30 with a metal gate 103. Elements with the same numeral labels in FIGS. 1 and 2 are directed to the same structure or materials, and are not repeated here for simplicity. Compared to FIG. 1, the thickness T1 of the first portion 105A and the thickness T3 of the second portion of the barrier layer 1033 in FIG. 3 are both zero. In other words, no barrier layer 1033 is present at the sidewall 103B of the metal gate 103. No stair profile can be observed in semiconductor structure 30.

In FIG. 3, a horizontal shift of the work function metal layer 1035 is about the same as that shown in FIG. 2, where the first portion 105A of the barrier layer 1033 is totally removed. In addition, a vertical shift toward the direction perpendicular to the bottom 103A of the metal gate 103 can be observed in FIG. 3. In FIG. 3, a joint A connecting the work function metal layer 1035 at the sidewall 103B and over the bottom 103A of the metal gate 103 is positioned even closer to the bottom corner C of the metal gate 103. Compared to the joint A in FIG. 2, the joint A shown in FIG. 3 further possesses a downward vertical shift toward the bottom 103A, and thus the aluminum atoms in the work function metal layer 1035 can more effectively arrive at the underlying barrier layer 1033 or a high-k dielectric layer 1031 positioned closer to the two ends of a channel region of an N-type transistor. In addition, the metal gate 103 of the semiconductor structure 30 further includes an optional nitride layer 1039 surrounding the sidewall spacer 1037 and the optional nitride layer 1039 is positioned over the first surface 100A of the semiconductor layer 100.

In some embodiments, the semiconductor structure 30 is a planar N-MOSFET with a channel length $L_g$ of from about 20 to about 40 nm. In other embodiments, the semiconductor structure 30 is a nonplanar N-FinFET with a channel length $L_g$ of from about 10 to about 20 nm.

Figure 4:
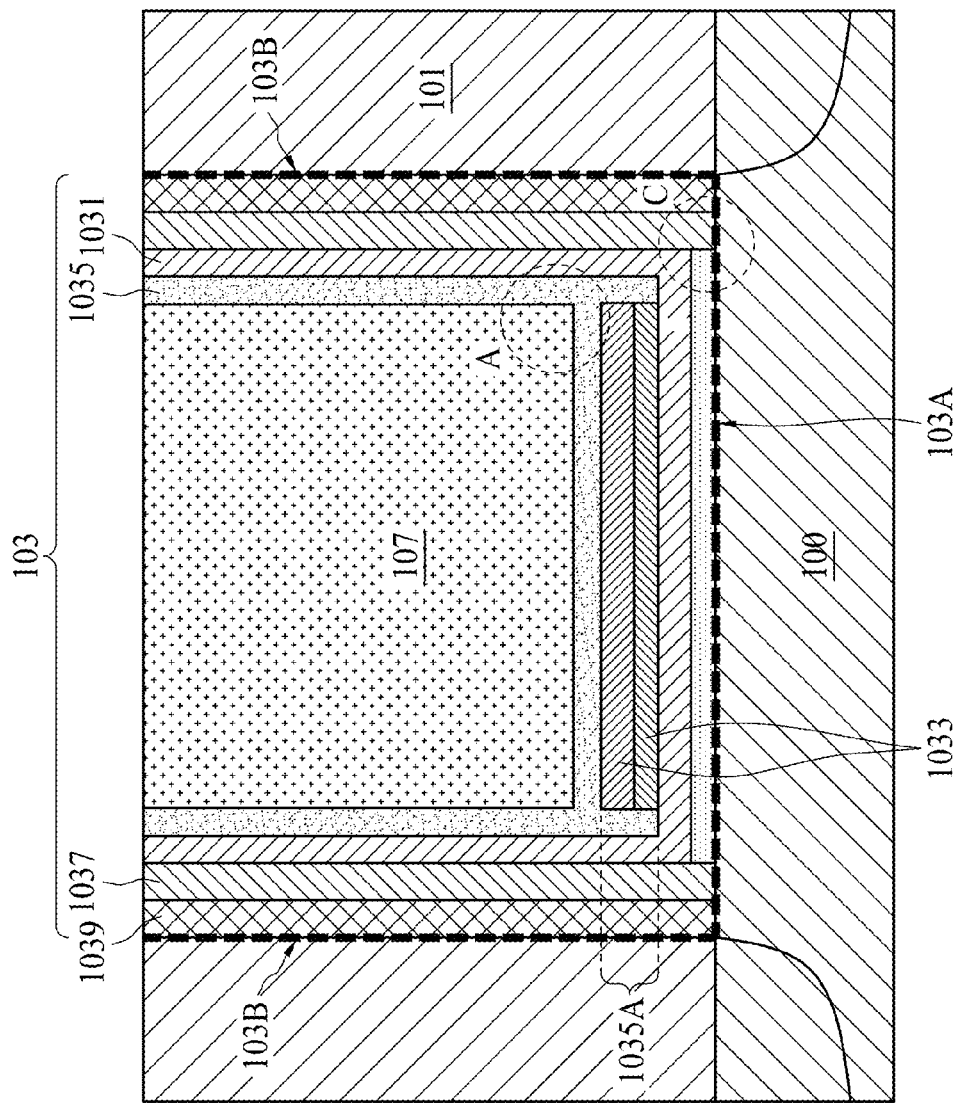
FIG. 4 is a cross sectional view of a semiconductor structure with a metal gate in accordance with some embodiments of the present disclosure.

FIG. 4 shows a cross sectional view of a semiconductor structure 40 with a metal gate 103. Elements with the same numeral labels in FIGS. 1, 2, and 3 are directed to the same structure or materials, and are not repeated here for simplicity. Similar to FIG. 3, the thickness T1 of the first portion 105A and the thickness T3 of the second portion of the barrier layer 1033 in FIG. 4 are both zero. In other words, no barrier layer 1033 is present at the sidewall 103B of the metal gate 103. No stair profile can be observed in semiconductor structure 40.

In FIG. 4, a horizontal shift of the work function metal layer 1035 is about the same as that shown in FIG. 3, where the first portion 105A and the second portion 105B of the barrier layer 1033 are totally removed. In addition, a vertical shift toward the direction perpendicular to the bottom 103A of the metal gate 103 can be observed in FIG. 4. In FIG. 4, the most proximal portion of the work function metal layer 1035 with respect to the bottom corner C of the metal gate 103 is a tail 1035A protruding from the joint A connecting the work function metal layer 1035 at the sidewall 103B and over the bottom 103A of the metal gate 103. Compared to the work function metal layer 1035 in FIG. 3, the work function metal layer 1035 shown in FIG. 4 further possesses a tail 1035A, effectively producing a vertical shift toward the bottom 103A, and thus the aluminum atoms in the work function metal layer 1035 can more effectively arrive at the underlying barrier layer 1033 or a high-k dielectric layer 1031 positioned closer to the two ends of a channel region of an N-type transistor. In addition, the metal gate 103 of the semiconductor structure 30 further includes an optional nitride layer 1039 surrounding the sidewall spacer 1037.

In some embodiments, the semiconductor structure 40 is a planar N-MOSFET with a channel length $L_g$ of from about 20 to about 40 nm. In other embodiments, the semiconductor structure 40 is a nonplanar N-FinFET with a channel length $L_g$ of from about 10 to about 20 nm.

In some embodiments where transistors with a mix of channel lengths are manufactured together on a same wafer, in order to eliminate the WCTO effect, different embodiments including those shown in FIG. 1 to FIG. 4 can be implemented to increase the diffusion efficacy of the aluminum atoms to the bottom corner of the metal gate. For example, one N-type transistor on the wafer with a comparatively longer channel length can adopt the metal gate structures shown in FIG. 1 or FIG. 2, whereas another N-type transistor on the same wafer with a comparatively shorter channel length can adopt the metal gate structures shown in FIG. 3 or FIG. 4.

Figure 5:
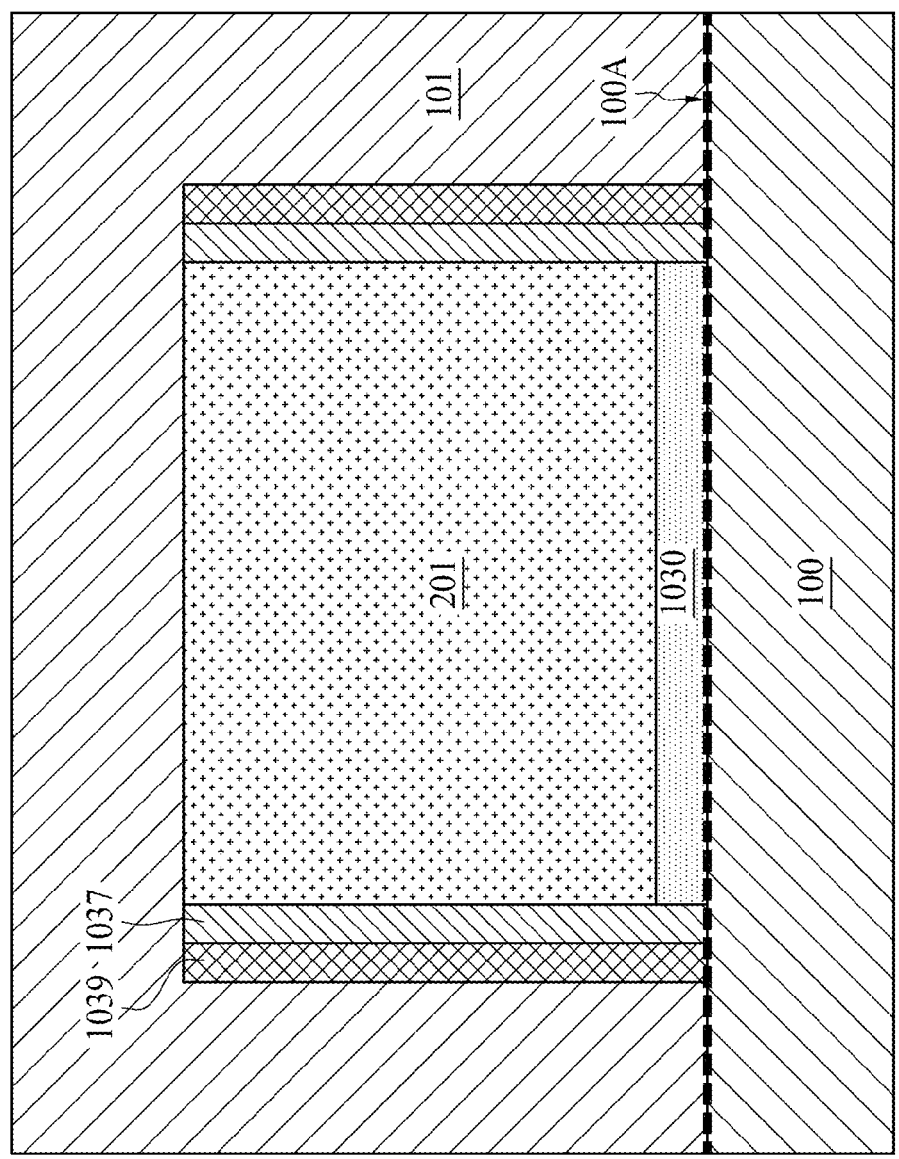
FIG. 5 is an operation of a semiconductor structure manufacturing method for a metal gate structure in accordance with some embodiments of the present disclosure.

FIG. 5 to FIG. 14 show the operations of a semiconductor structure manufacturing method for a metal gate structure in accordance with some embodiments of the present disclosure. A metal gate trench 103C is formed in operations described from FIG. 5 to FIG. 7. In FIG. 5, a sacrificial gate electrode 201 is capped within an ILD 101. An interlayer 1030, a spacer 1037, and a nitride layer 1039 are formed on a semiconductor layer 100 according to the current art. In some embodiments, the interlayer 1030 is ideally formed from a material which will not sufficiently etch during the removal or etching of the sacrificial gate electrode 201 so that it can protect the underlying semiconductor layer 100 when the sacrificial gate electrode 201 is subsequently removed. If the interlayer 1030 is a grown dielectric it will form only on the exposed surfaces of the semiconductor layer 100. If the interlayer 1030 is a deposited film it will be blanket deposited onto an insulating substrate (not shown) underneath the semiconductor layer 100 as well as onto the semiconductor layer 100.

In FIG. 5, the spacer 1037 and the nitride layer 1039 are formed on the sidewalls of the sacrificial gate electrode 201. The spacers 1037 and the nitride layer 1039 can be formed by blanket depositing a conformal dielectric film covering the top surface and the sidewall of the sacrificial gate electrode 201. The blanket deposited spacers 1037 is also formed on the first surface 100A of the semiconductor layer 100. The materials forming the spacer 1037 and the nitride layer 1039 include, but not limited to, silicon nitride, silicon oxide, silicon oxynitride or combination thereof. In some embodiment of the present disclosure, the spacer 1037 is a silicon nitride film formed by a hot wall, low pressure chemical vapor deposition (LPCVD) operation. Next, the spacer 1037 and the nitride layer 1039 are anisotropically etched by, for example, plasma etching or reactive ion etching (RIE). The anisotropic etch of the spacer 1037 and the nitride layer 1039 removes the dielectric film from horizontal surfaces, such as the top of the sacrificial gate electrode 201 as well as the first surface 100A of the semiconductor layer 100. In some embodiments, the RIE etch is continued for sufficient period of time to remove the spacer 1037 and the nitride layer 1039 from all horizontal surfaces.

Figure 6:
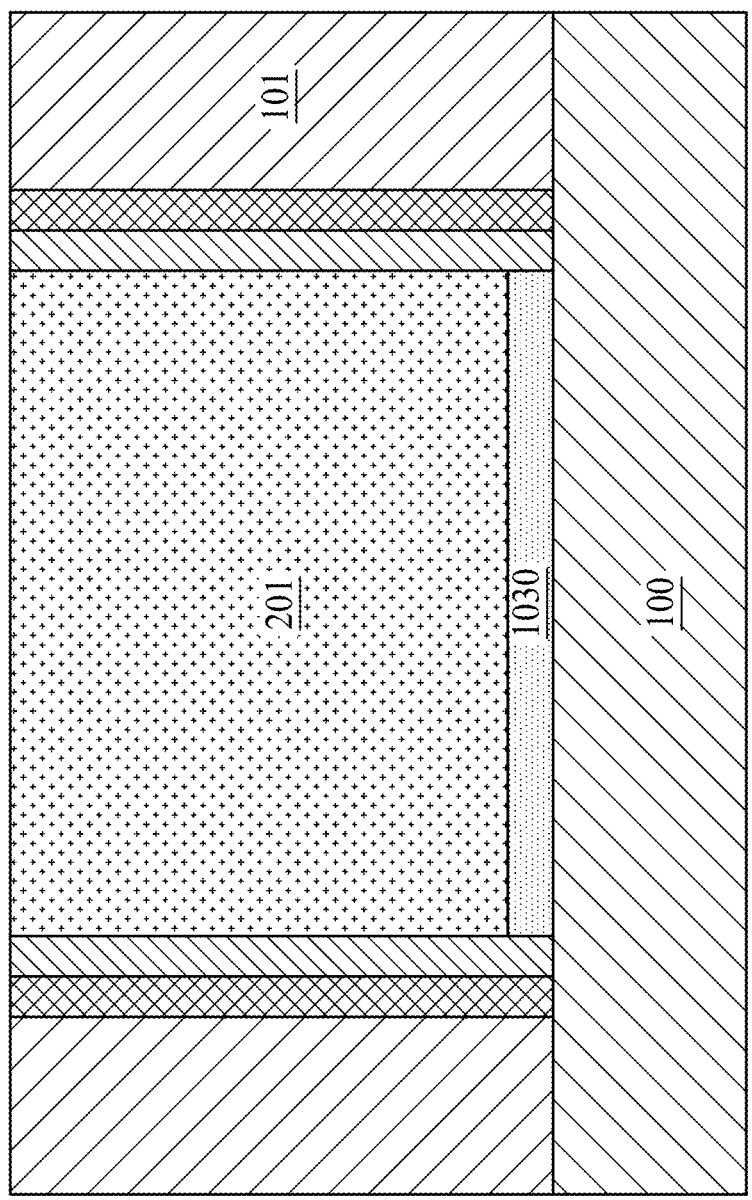
FIG. 6 is an operation of a semiconductor structure manufacturing method for a metal gate structure in accordance with some embodiments of the present disclosure.
Figure 7:
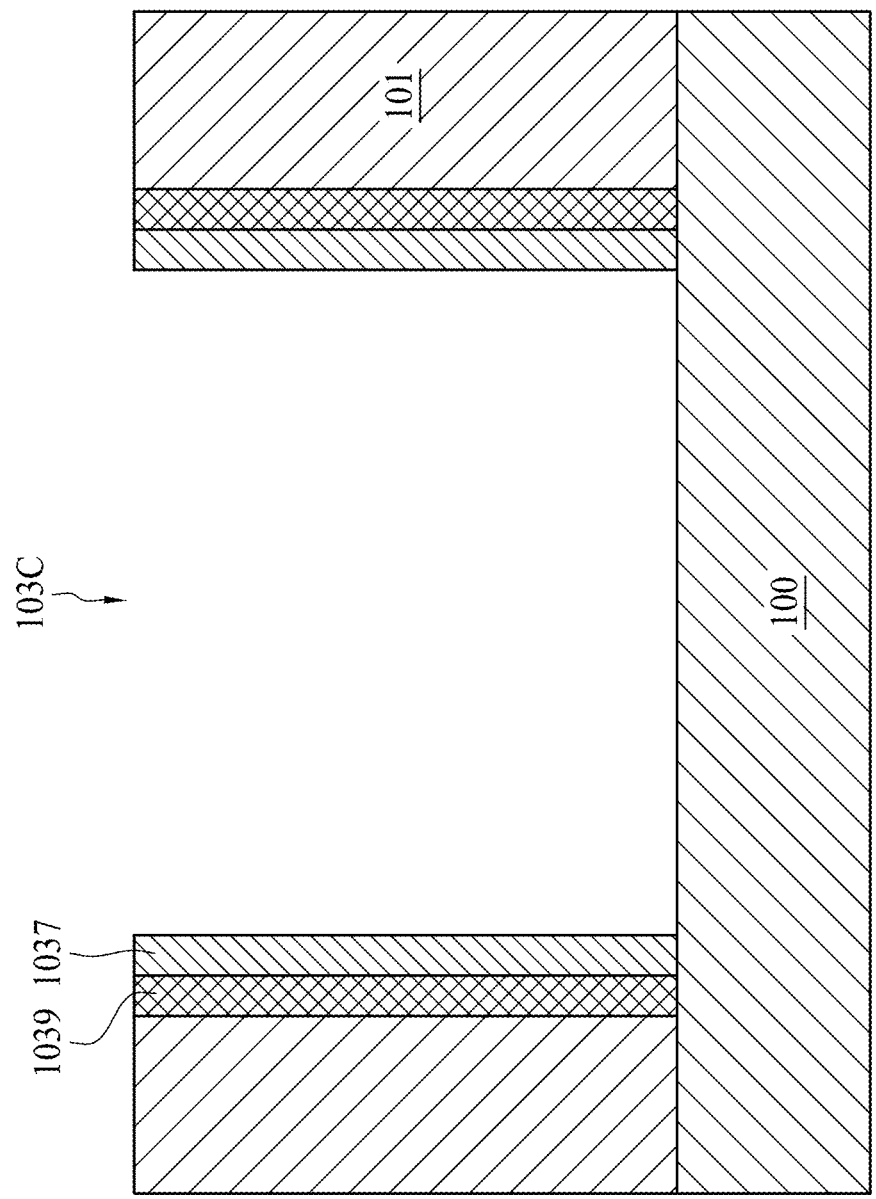
FIG. 7 is an operation of a semiconductor structure manufacturing method for a metal gate structure in accordance with some embodiments of the present disclosure.

In FIG. 6, a planarization operation such as a chemical mechanical polishing (CMP) operation is performed after the formation of the spacer 1037, the nitride layer 1039, and the ILD 101. The planarization operation is carried out to remove the excess ILD 101 over the top surface of the sacrificial gate electrode 201 until the sacrificial gate electrode 201 is exposed from the ILD 101. In FIG. 7, the metal gate trench 103C is formed by removing the sacrificial gate electrode 201 and the interlayer 1030. In some embodiments, the sacrificial gate electrode 201 is formed of polysilicon. The polysilicon sacrificial gate electrode 201 is removed utilizing a wet etchant comprising tetramethylammonium hydroxide and water. In an embodiment of the present disclosure, tetramethylammonium hydroxide comprises between 10-35% of the solution by volume. In an embodiment of the present disclosure, the tetramethylammonium hydroxide solution is heated to a temperature between 60-95 degrees Celsius during the etching. In an embodiment of the present disclosure, sonic energy such as, ultrasonic or megasonic energy, is applied during the etch process. Sonic energy provides agitation to the etchant which enables etch residue to be removed from altered sacrificial gate electrode 201 and allows new etchant to enter into trench to etch the sacrificial gate electrode 201.

In some embodiments of the present disclosure, the etchant for sacrificial gate electrode 201 is selective to the interlayer 1030 (i.e., does not etch or only slightly etches the interlayer 1030) so that the interlayer 1030 acts as an etch stop for the sacrificial gate electrode 201 etch. In this way, the underlying channel regions of semiconductor layer 100 are protected from the etchant. In some embodiments, an etch selectivity between a sacrificial gate electrode to an interlayer dielectric of at least 10:1, is desired.

Next, the interlayer 1030 is removed. In an embodiment of the present disclosure, the interlayer 1030 is an oxide and can be removed with an etchant comprising aqueous hydrofluoric acid. In an embodiment of the present disclosure, a 1-2% HF by volume in water etchant is used.

Figure 8:
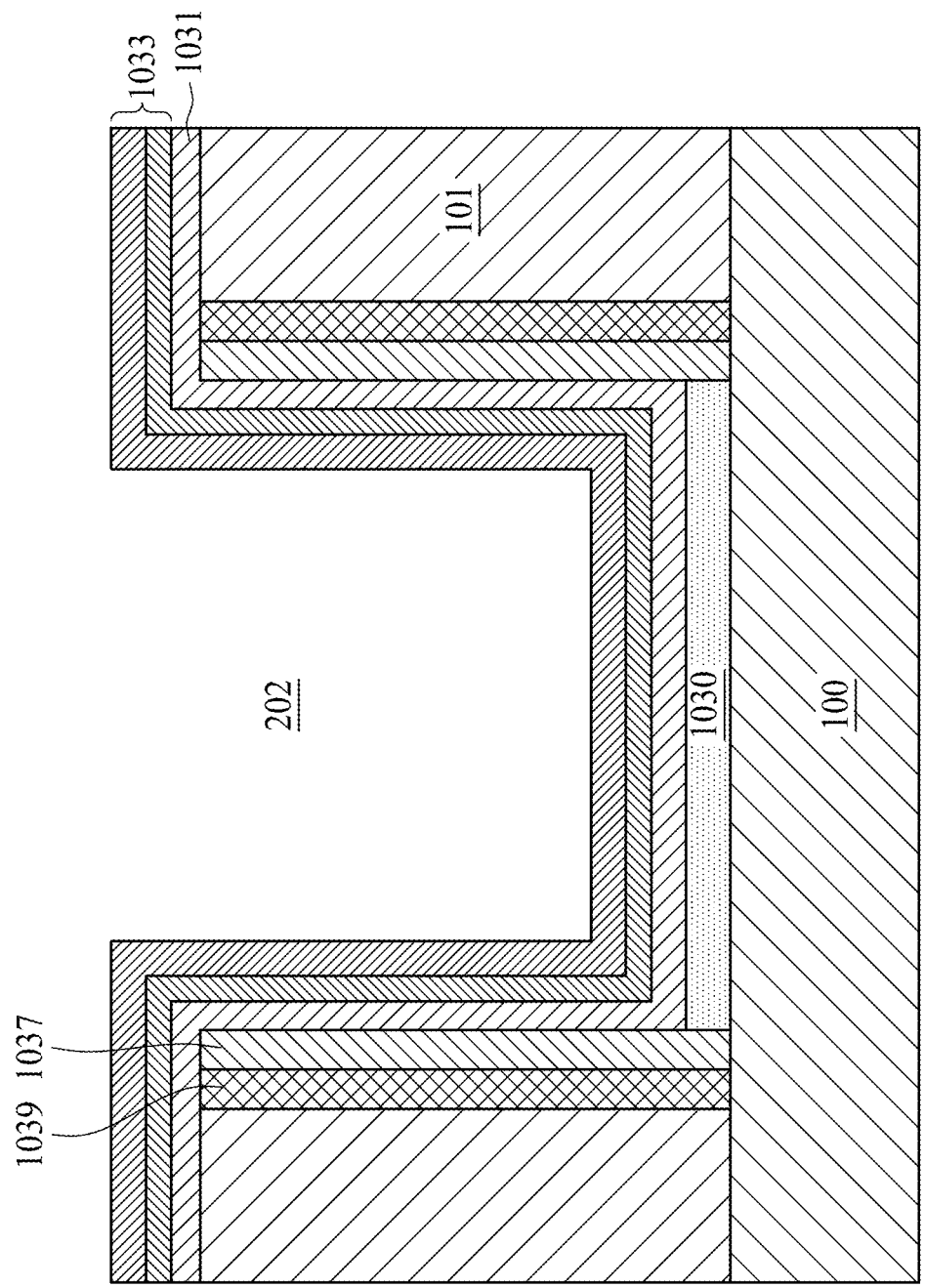
FIG. 8 is an operation of a semiconductor structure manufacturing method for a metal gate structure in accordance with some embodiments of the present disclosure.

Referring to FIG. 8, an interlayer 1030, a high-k dielectric layer 1031, and a barrier layer 1033 is formed in a conformal manner inside the metal gate trench 103C and the top of the ILD 101. In some embodiments, the interlayer 1030 is eliminated, and the high-k dielectric layer 1031 is directly formed proximal to the channel region of the semiconductor layer 100. In an embodiment of the present disclosure, the high-k dielectric layer 1031 is grown to a thickness of between 5-50 Å. In an embodiment of the present disclosure, the high-k dielectric layer 1031 is a deposited dielectric, such as but not limited to a metal oxide dielectric, such as tantalum pentoxide ($Ta_2O_5$) and titanium oxide ($TiO_2$), tantalum oxide, hafnium oxide, zirconium oxide, aluminum oxide, lanthanum oxide, lanthanum aluminum oxide and silicates thereof or other high k dielectrics, such as PZT and BST. A high dielectric constant film can be formed by any well known technique, such as but not limited to chemical vapor deposition (CVD) or atomic layer deposition (ALD). In some embodiments, the barrier layer 1033 is formed over the high-k dielectric layer 103. In some embodiments, the barrier layer 1033 includes TiN or TaN having a thickness ranging from about 5 to about 30 Å. The barrier layer 1033 functions as a barrier to protect the high-k dielectric layer 103. The barrier layer 1033 is formed by various deposition techniques such as ALD, PVD, CVD, PECVD, or other suitable techniques.

In some embodiments, the barrier layer 1033 includes a bilayer structure. For example, the bilayer structure can be made of any two of metal carbonitride layer, TiN, and TaN. In some embodiments, a first layer in the bilayer structure (close to the high-k dielectric layer 1031) is formed by depositing a TiN film having a thickness of from about 1 to about 20 Å. A second layer in the bilayer structure (close to a work function metal layer 1035) is formed by depositing a TaN film having a thickness of from about 1 to about 20 Å

Figure 9:
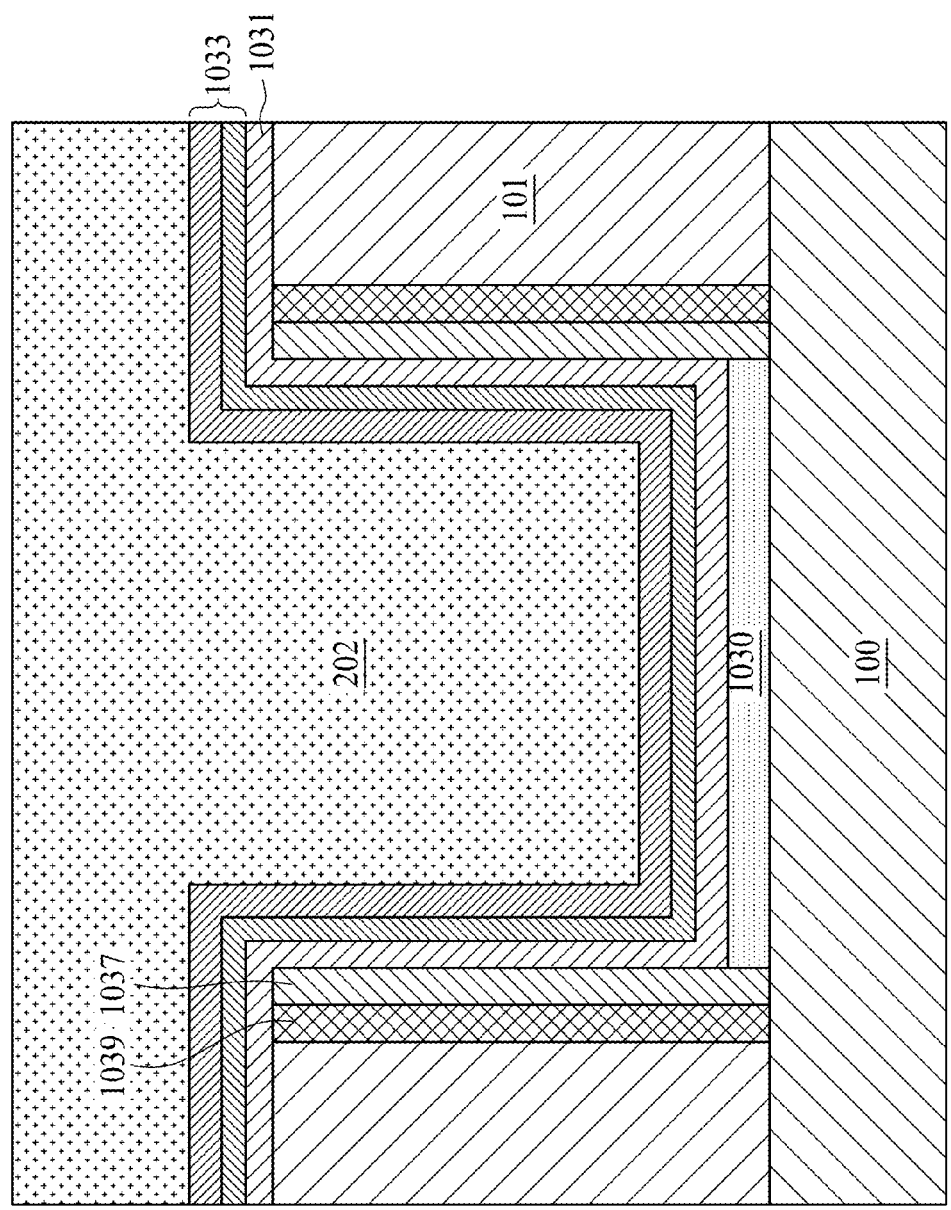
FIG. 9 is an operation of a semiconductor structure manufacturing method for a metal gate structure in accordance with some embodiments of the present disclosure.

FIG. 9 to FIG. 12 show operations of removing a first portion 105A of the barrier layer 103 at the sidewall 103B of the metal gate trench 103C. As shown in FIG. 9, an etchable material 201 is overfilled inside the metal gate trench 103C and on top of the ILD 101. Any material that is able to achieve a gap filling and can be removed by an etching operation can be used as the etchable material 201. In some embodiments, the etchable material 201 is spin-on glass (SOG). Most commonly used SOG materials are of two types: an inorganic type of silicate based SOG and an organic type of siloxane based SOG. In some embodiments, a silicon oxide based polysiloxane is applied to a wafer as a liquid to fill the metal gate trench 103C. The dispensed SOG is then spun and cured at a temperature of approximately 400 degrees Celsius.

Figure 10:
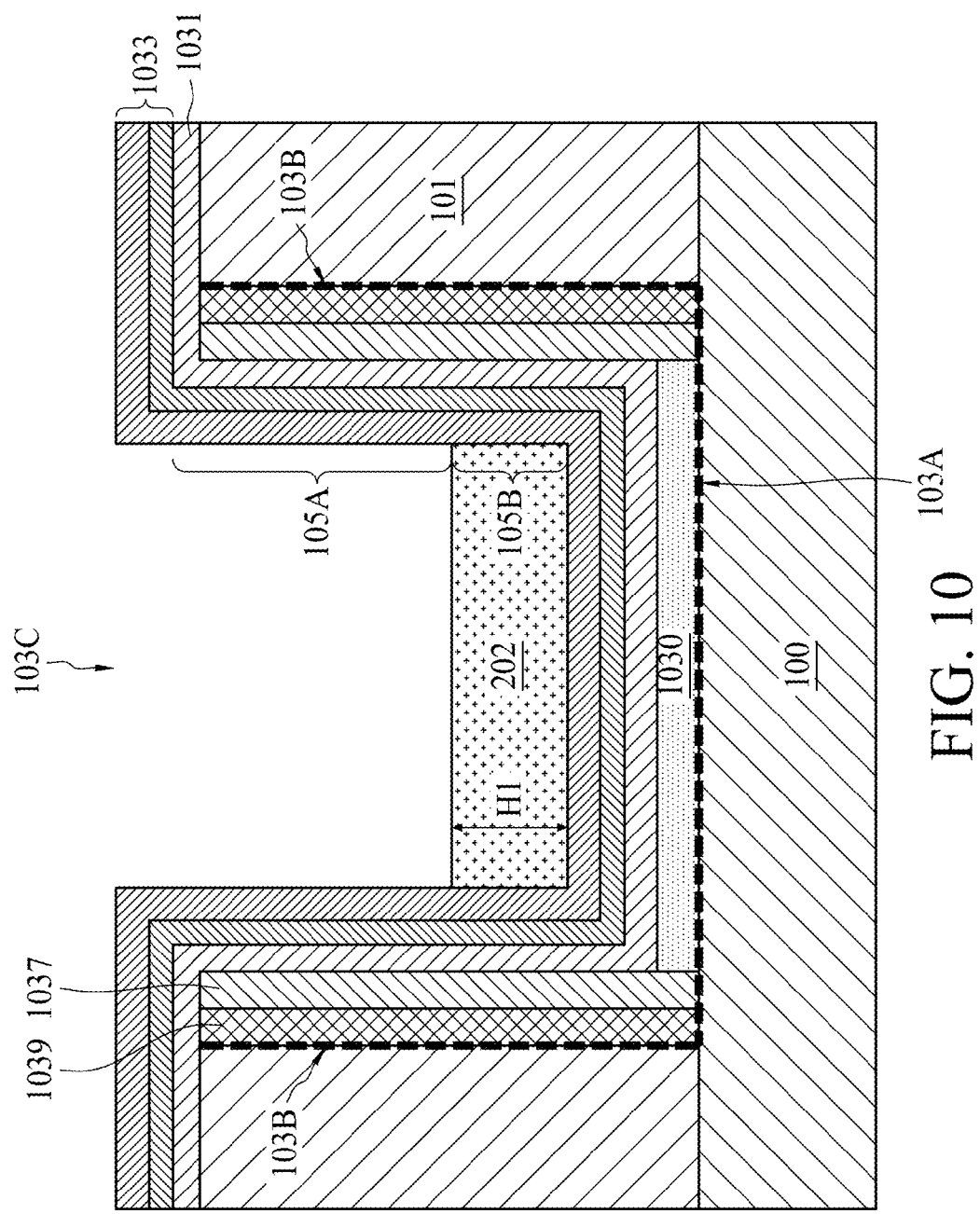
FIG. 10 is an operation of a semiconductor structure manufacturing method for a metal gate structure in accordance with some embodiments of the present disclosure.

In FIG. 10, the etchable material 202 is etched back to a predetermined height H1 in the metal gate trench 103C, and the first portion 105A of the barrier layer 1033 is exposed after the etch back operation. In some embodiments, when the etchable material 202 is SOG, a wet or a dry etch operation can be used to remove the SOG. For example, a wet etch operation including an etch rate-controlled buffer oxide etch (BOE) or diluted HF etch is used to remove a desired amount of SOG. For another example, a dry etch operation includes a plasma or reactive ion etch with fluorocarbon gases such as $CF_4$, $CHF_3$, or $SF_6$, Ar and $O_2$. The RF power, gas flow and the relative gas proportion is adjusted to remove a desired amount of SOG. In some embodiments, the predetermined height H1 is in a range of from about 2Å to about 20Å. Because the barrier layer 1033 deposited on the top surface of the ILD 101, when the SOG etch back is carried out, the underlying high-k dielectric layer 1031 will not etch by the fluoride-containing etchant. In other words, the barrier layer 1033 made of metal nitride functions as a hard mask protecting the high-k dielectric layer 1031 from being etched while the oxide-based etchable materials is removed.

Although SOG can be use as an etchable material in the present disclosure, other materials such as photoresist, deposited oxide, or boro-phospho-silicate-glass (BPSG) can be used as etchable material, as long as an etchant can selectively remove the photoresist, deposited oxide, or BPSG at the presence of metal nitride (i.e. does not etch or only slightly etches metal nitride).

Figure 11:
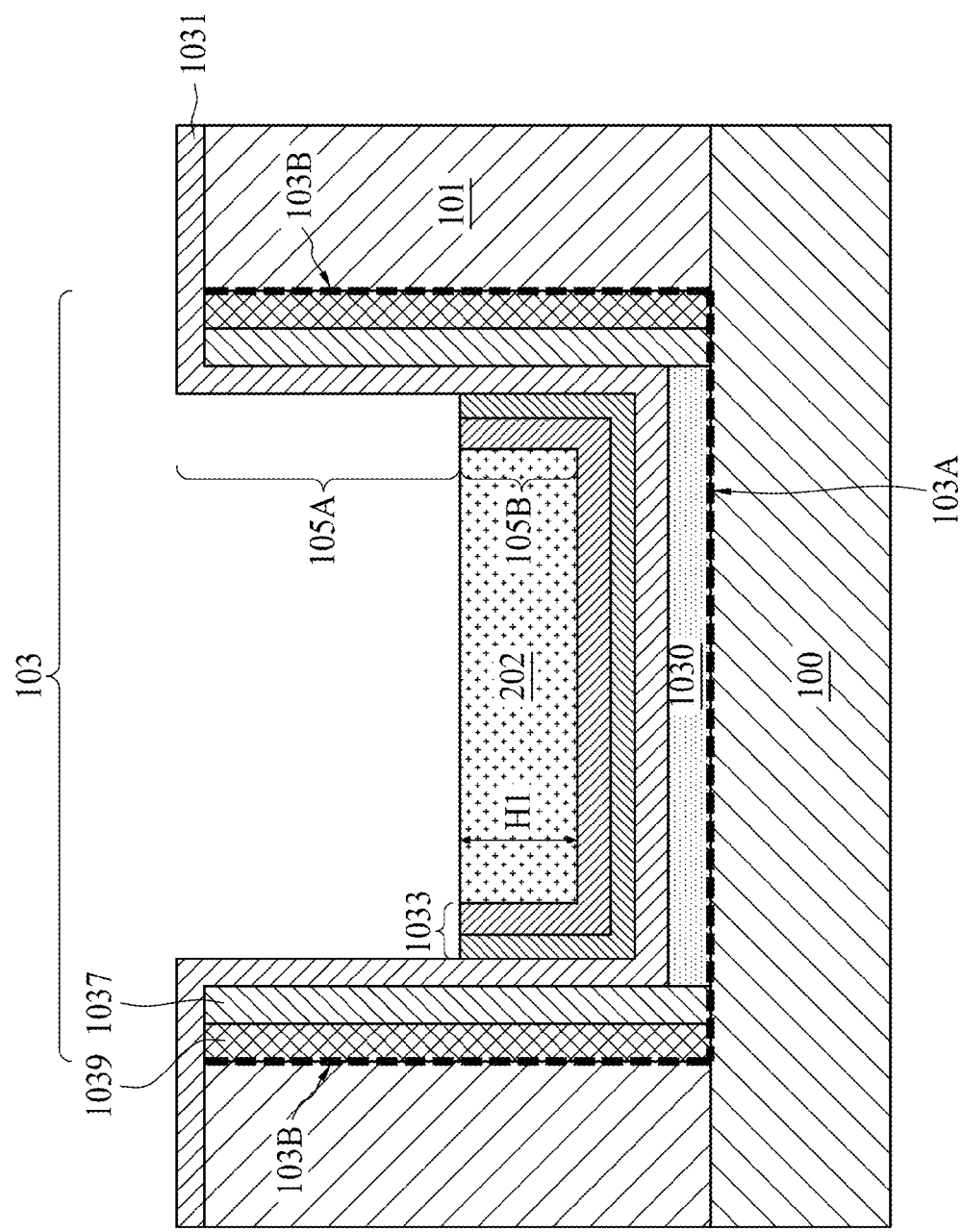
FIG. 11 is an operation of a semiconductor structure manufacturing method for a metal gate structure in accordance with some embodiments of the present disclosure.

In FIG. 11, the first portion 105A of the barrier layer 1033 is removed by a dry or a wet etch operation. In some embodiments, the first portion 105A of the barrier layer 1033 is defined as the portion exposed after the etch-back of the etchable material as shown in FIG. 10. In some embodiments, a wet etchant for removing the barrier layer 1033 (for example, metal carbon nitride) includes 30 to 40 portions (by weight) of nitric acid, 10 portions of hydrofluoric acid and 10 portions of water. Another wet etchant for removing the barrier layer 1033 (for example, metal nitride such as TiN or TaN) includes a mixture of phosphoric acid ($H_3PO_4$, 80%), acetic acid ($CH_3COOH$, 5%), nitric acid ($HNO_3$, 5%), and water ($H_2O$, 10%). In some embodiments, a dry etch operation for removing the barrier layer 1033 includes a plasma or an RIE operation with an etch gas including $Cl_2$ or $BCl_3$. A height H1 of the etchable material 202 is thick enough to sustain the dry etch operation removing the first portion 105A of the barrier layer 1033 but still laterally shielding the second portion 105B of the barrier layer 1033 and covering the barrier layer at the bottom 103A of the metal gate 103. In some embodiments, the predetermined height H1 is in a range of from about 2Å to about 20Å.

In some embodiments, the removing of the first portion 105A of the barrier layer 1033 does not completely remove the barrier layer 1033 and a finite thickness of the barrier layer 1033 remains as residuals on the sidewall 103B of the metal gate 103. Any partial removal of the first portion 105A of the barrier layer 1033 resulting to a horizontal shift of the subsequently deposited the work function metal layer 1035 is within the contemplating scope of the present disclosure.

Figure 12:
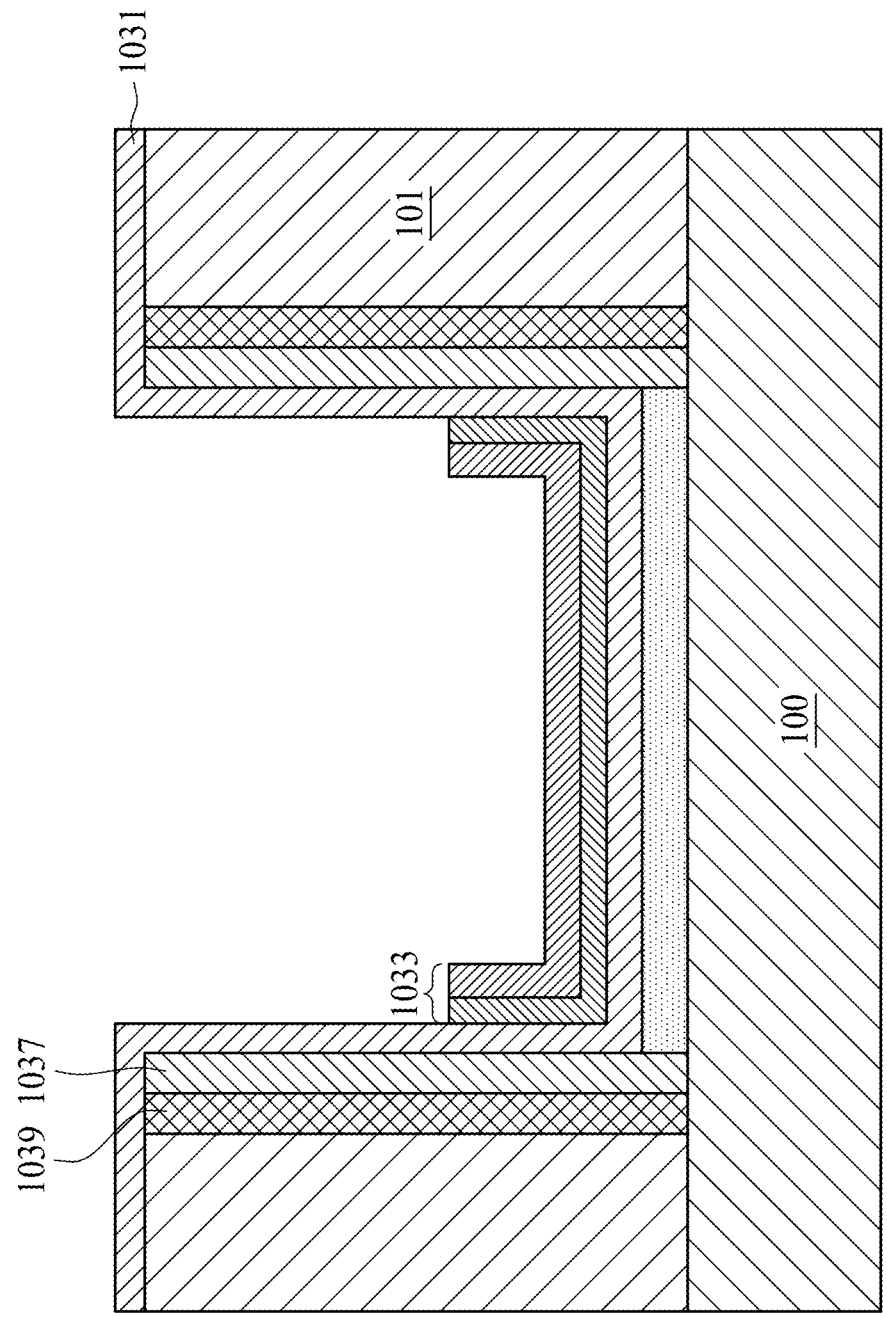
FIG. 12 is an operation of a semiconductor structure manufacturing method for a metal gate structure in accordance with some embodiments of the present disclosure.

In FIG. 12, the remaining etchable material 202 shown in FIG. 11 is removed by a second etch. In some embodiments, the etchant used is selective to the barrier layer 1033 (i.e., does not etch or only slightly etches barrier layer) so that the barrier layer acts as an etch stop for the remaining etchable material 202 etch. In this way, the underlying channel regions of semiconductor layer 100 are protected from the etchant. In some embodiments, an etchable material to barrier layer etch selecting of at least 10:1 is desired. In some embodiments where the first portion 105A of the barrier layer 1033 is completely removed, a portion of the high-k dielectric layer 1031 is exposed and thus the etchant removing an oxide-based etchable material can inevitably etch the high-k dielectric layer 1031 positioned at the top surface of the ILD 101 and at the sidewall 103B of the metal gate 103. However, the high-k dielectric layer 1031 at the bottom of the metal gate is protected from the barrier layer 1033 and thus is not damaged. When the remaining etchable material 202 is SOG, a dry etch operation can be used to remove the remaining SOG. For example, a dry etch operation includes a plasma or reactive ion etch with etch gas of $CF_4$, $CHF_3$, Ar and $O_2$. The RF power, gas flow and the relative gas proportion is adjusted to remove the remaining SOG.

In some embodiments where the first portion 105A of the barrier layer 1033 is thinned down rather than being completely removed, and the remaining etchable material 202 is SOG, a wet etch of a dry etch operation can be used to remove the remaining SOG. The dry etch operation suitable for the present operation is previously described with reference to FIG. 12. A wet etch operation including an etch rate-controlled buffer oxide etch (BOE) or diluted HF etch is used to remove the remaining SOG. Because the first portion 105A of the barrier layer 1033 is covered by a thinned barrier layer 1033, the wet etchant is selective to the barrier layer 1033 (i.e., does not etch or only slightly etches barrier layer) and removing the SOG at a greater etching rate.

Figure 13:
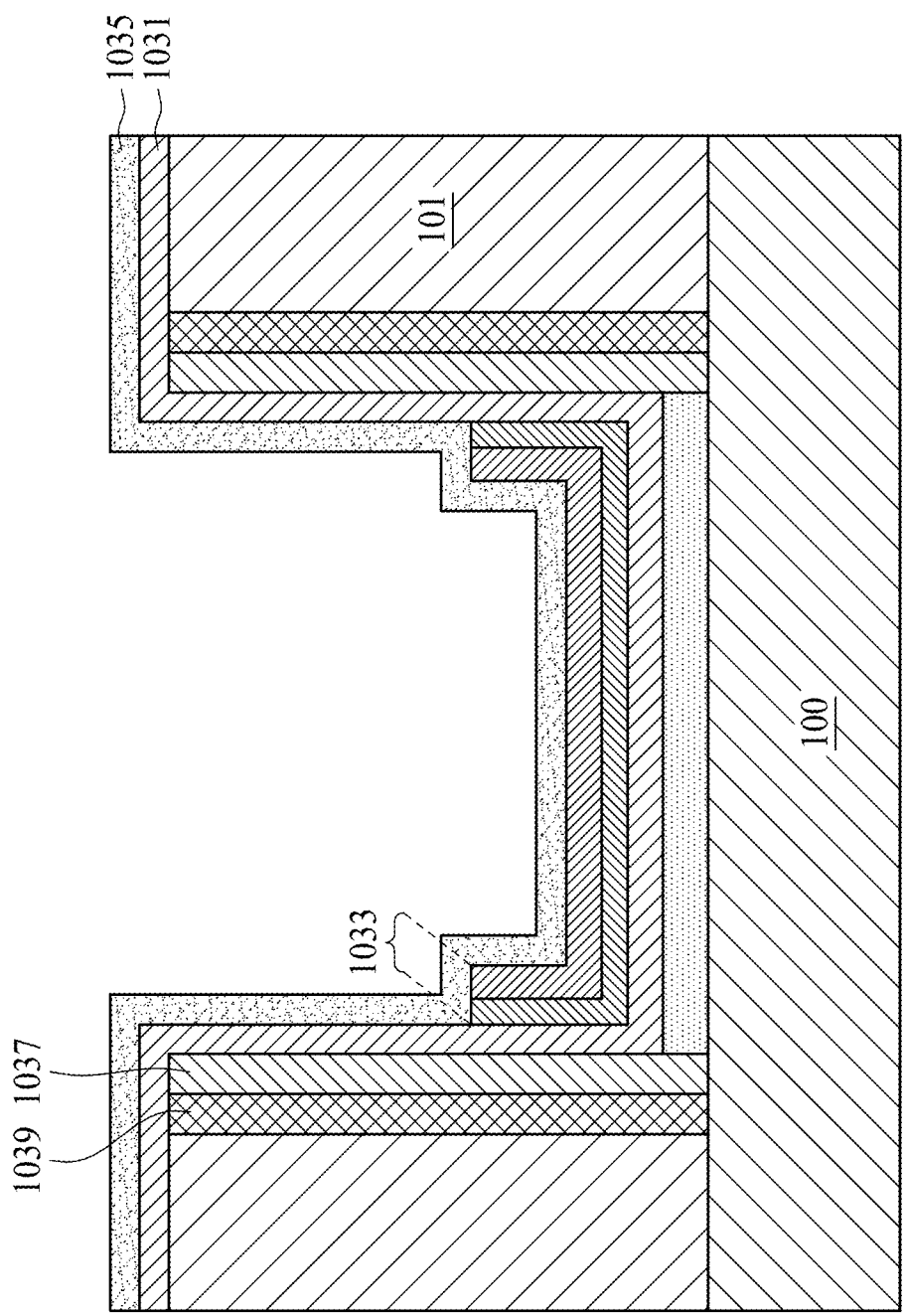
FIG. 13 is an operation of a semiconductor structure manufacturing method for a metal gate structure in accordance with some embodiments of the present disclosure.

In FIG. 13, a work function metal layer 1035 is formed in a conforming manner on the barrier layer 1033 and the high-k dielectric layer 1031. In some embodiments, the work function layer 1035 is formed over the barrier layer 1033 by an atomic layer deposition, a physical vapor deposition, a chemical vapor deposition, sputtering, or other suitable operations. In some embodiments, the work function metal layer 1035 includes suitable metals such as metal carbonitride, metal aluminide, metal silicon nitride, TiN, TiSiN, TiAlN, TiAl, TaAl, TaN, or Ru, that properly perform in an n type transistor. In some embodiments, the N work function layer 1035 includes a multi-metal layer structure such as TiN/WN. In some embodiments, aluminum atom is doped within the work function metal layer 1035 via an ALD operation. In other embodiments, an aluminum ion implantation operation is carried out after the formation of the work function metal layer 1035 in order to adjust the threshold voltage or the work function of the metal gate electrode for an n type transistor.

Figure 14:
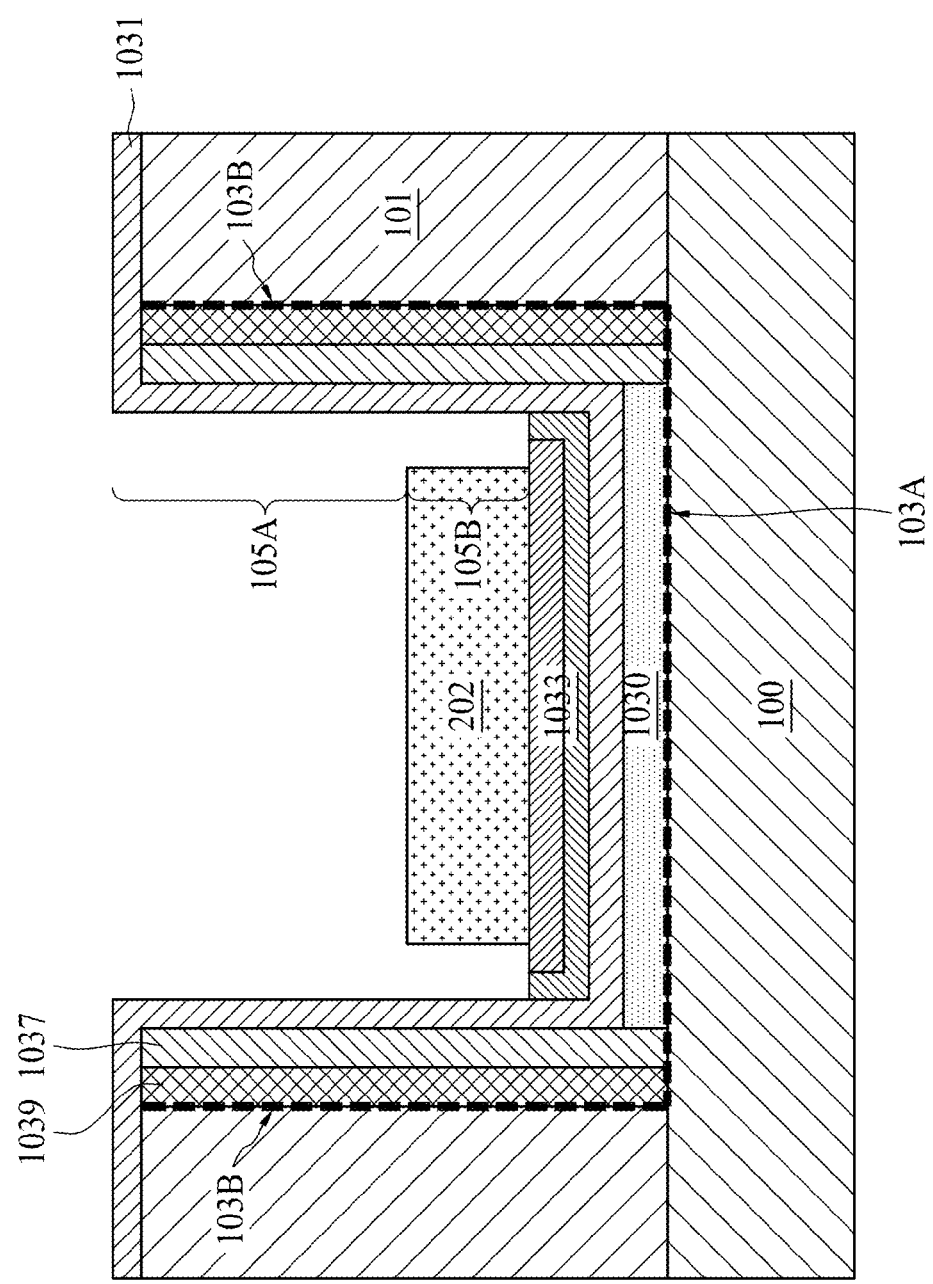
FIG. 14 is an operation of a semiconductor structure manufacturing method for a metal gate structure in accordance with some embodiments of the present disclosure.
Figure 15:
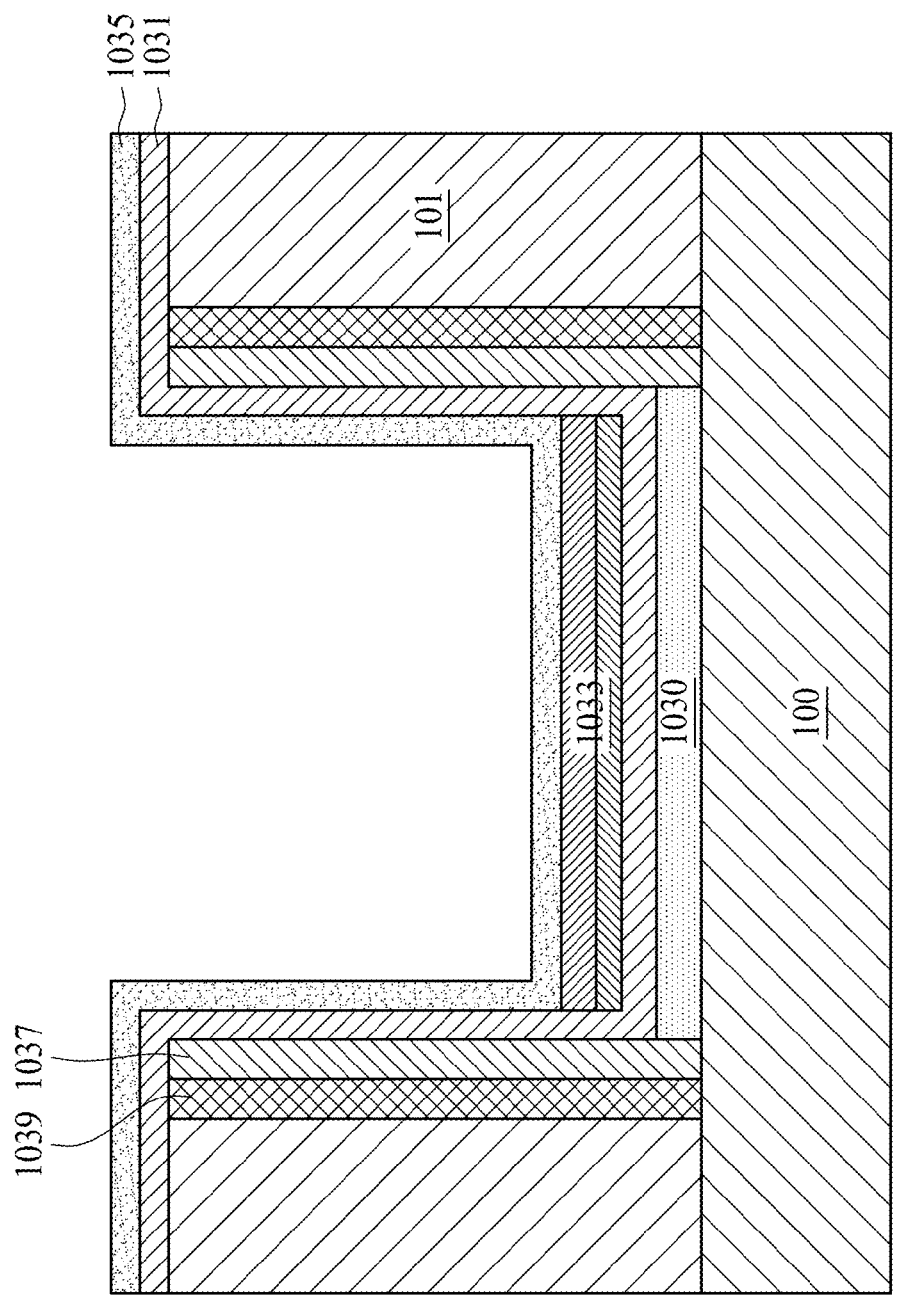
FIG. 15 is an operation of a semiconductor structure manufacturing method for a metal gate structure in accordance with some embodiments of the present disclosure.

Referring to FIG. 10, FIG. 14, and FIG. 15, when the removing of the first portion 105A of the barrier layer 1033 previously described with reference to FIG. 11 is performed in an over-etch manner, the second portion 105B as well as the first portion 105A of the barrier layer 1033 at the sidewall 103B of the metal gate 103 are substantially removed. In some embodiments, a thickness H1 of the etchable material 202 originally determined with reference to FIG. 10 is thick enough to sustain the over-etch operation imposed on the barrier layer 1033 at the sidewall 103B but still protect the barrier layer 1033 at the bottom 103A from the etchant. In some embodiments, the height H1 is in a range of from about 2Å to about 20Å. As shown in FIG. 15, a work function metal layer 1035 is formed in a conforming manner on the barrier layer 1033 and the high-k dielectric layer 1031. The formation of the work function metal layer 1035 is previously described with reference to FIG. 13 and is not repeated here for simplicity.

Figure 16:
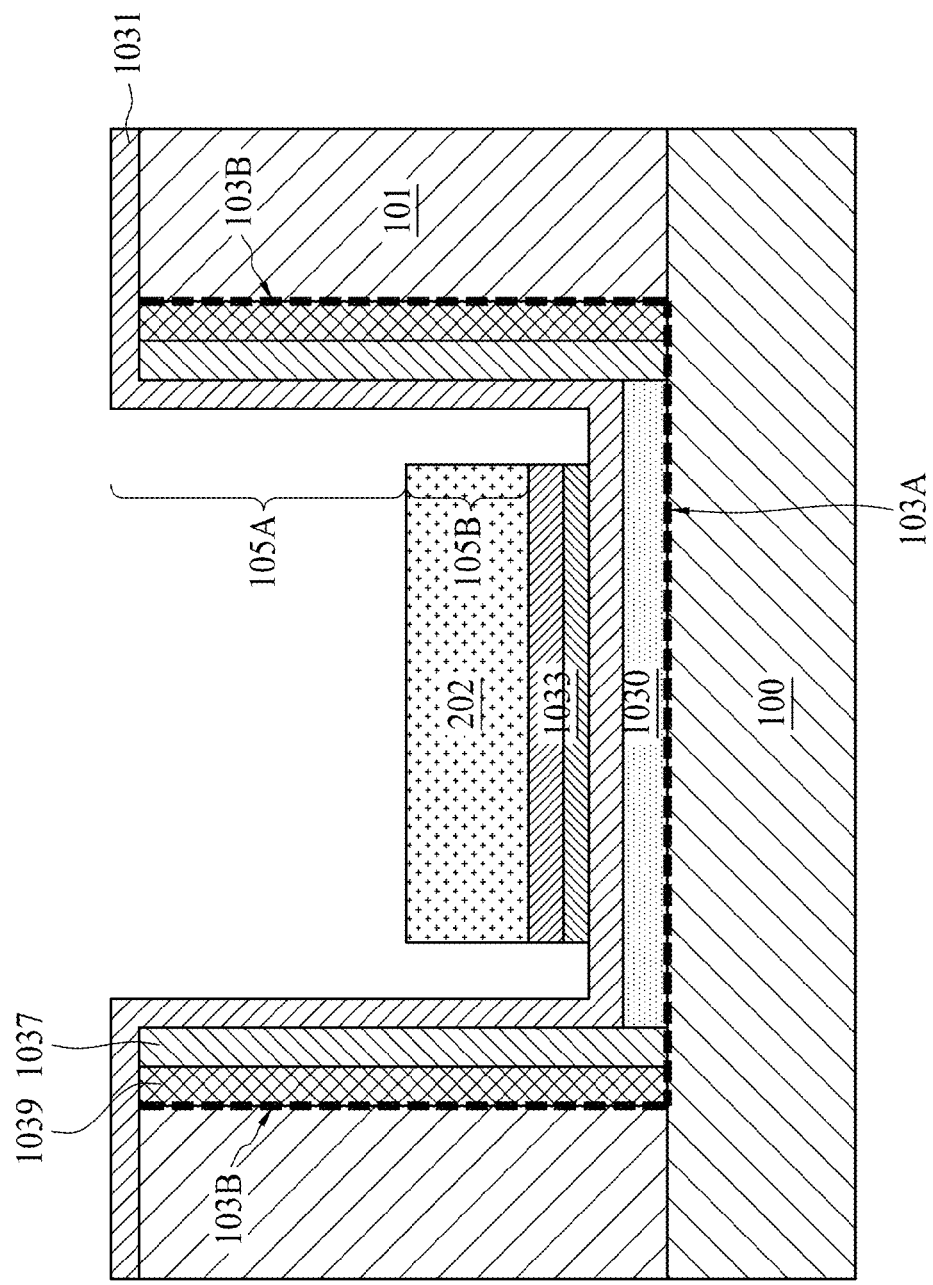
FIG. 16 is an operation of a semiconductor structure manufacturing method for a metal gate structure in accordance with some embodiments of the present disclosure.
Figure 17:
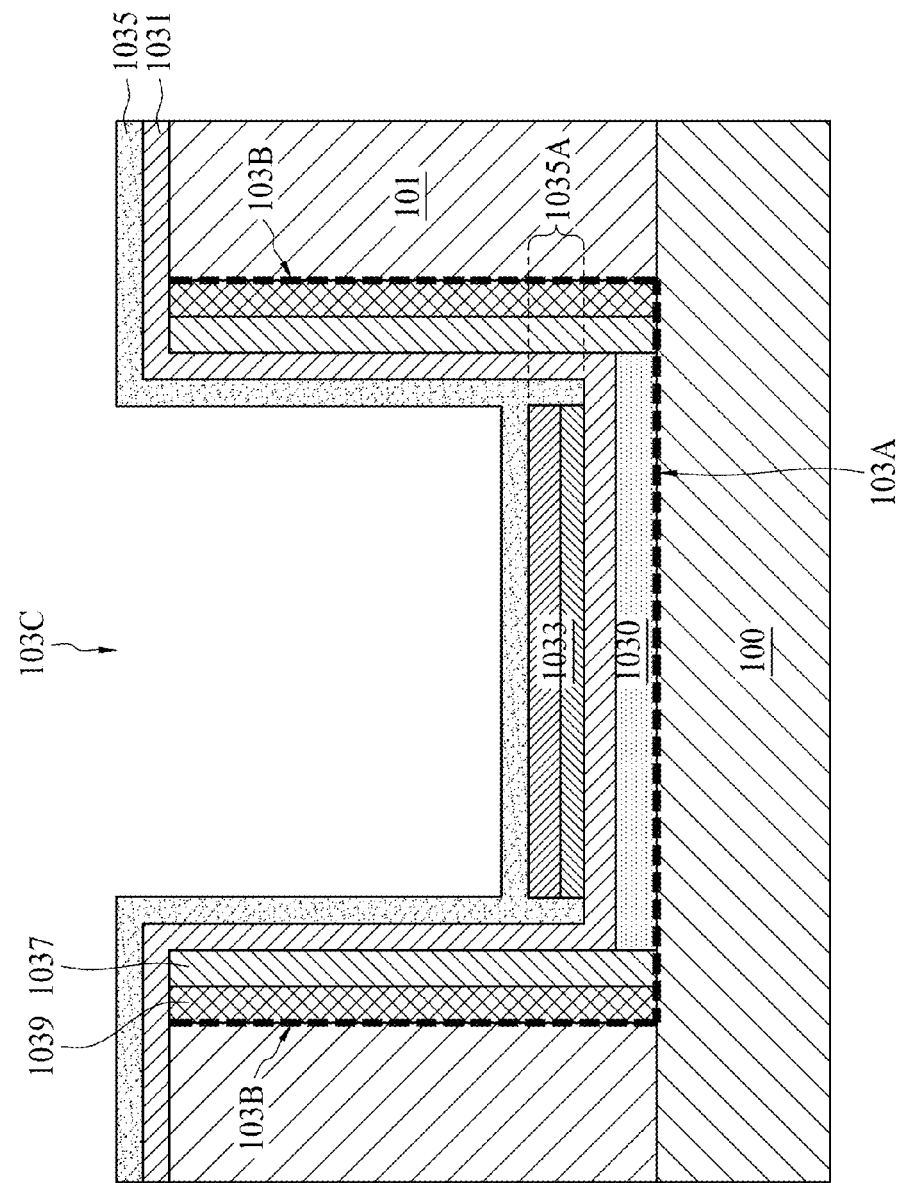
FIG. 17 is an operation of a semiconductor structure manufacturing method for a metal gate structure in accordance with some embodiments of the present disclosure.

Referring to FIG. 10, FIG. 16, and FIG. 17, when the removing of the first portion 105A of the barrier layer 1033 is performed in an over-etch manner, the second portion 105B, the first portion 105A of the barrier layer 1033 at the sidewall 103B, and the barrier layer 1033 below the second portion 105B but not covered by the etchable material 202, are substantially removed. In some embodiments, the thickness H1 of the etchable material 202 originally determined with reference to FIG. 10 is thick enough to sustain the over-etch operation imposed on the barrier layer 1033 at the sidewall 103B but still protect the barrier layer 1033 at the bottom 103A from the etchant. In some embodiments, the height H1 is in a range of from about 2Å to about 20Å. As shown in FIG. 17, a work function metal layer 1035 is formed in a conforming manner on the barrier layer 1033 and the high-k dielectric layer 1031. In some embodiments, a portion 1035A of the work function metal layer 1035 is contacting the high-k dielectric layer 1031 at the bottom 103A of the metal gate 103. The formation of the work function metal layer 1035 is previously described with reference to FIG. 13 and is not repeated here for simplicity.

Figure 18:
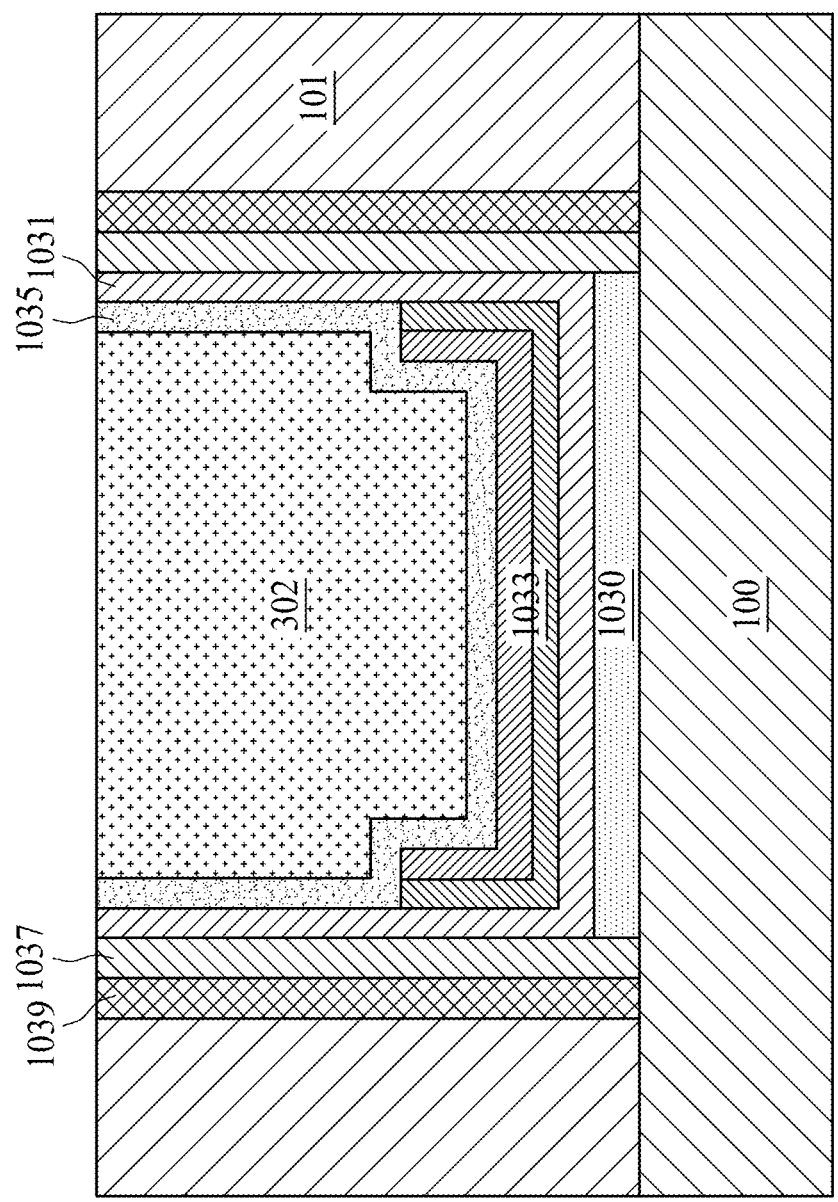
FIG. 18 is an operation of a semiconductor structure manufacturing method for a metal gate structure in accordance with some embodiments of the present disclosure.

Referring to FIG. 18, a gate fill metal 302 is overfilled into the metal gate trench 103C. In some embodiments, a single metal including W, WN, TaN, or Ru is sputtered into the metal gate trench 103C, and followed by a CMP operation to remove the overfilled gate fill metal 302 and the work function metal layer 1035 on a top surface of the ILD 101. In some embodiments, the gate fill metal 302 includes a multi-metal layer structure such as TaN, TiN, W, WN, and WCN, or any combination thereof.

Some embodiments of the present disclosure provide a semiconductor structure. The semiconductor structure includes a semiconductor layer having a first surface and an interlayer dielectric (ILD) defining a metal gate over the first surface of the semiconductor layer. The metal gate includes a high-k dielectric layer conforming to a bottom and a sidewall of the metal gate; a barrier layer conforming to the high-k dielectric layer; and a work function metal layer conforming to the barrier layer and the high-k dielectric layer. A thickness of a first portion of the barrier layer at the sidewall of the metal gate is substantially thinner than a thickness of the barrier layer at the bottom of the metal gate.

In some embodiments, the thickness of the first portion of the barrier layer at the sidewall of the metal gate of the semiconductor structure is zero.

In some embodiments, a height of a second portion of the barrier layer at the sidewall of the metal gate of the semiconductor structure is more than 2Å.

In some embodiments, no barrier layer is at the sidewall of the metal gate of the semiconductor structure.

In some embodiments, the barrier layer of the metal gate of the semiconductor structure includes a bilayer.

In some embodiments, the thickness of the first portion of the barrier layer is thinner than the thickness of the second portion of the barrier layer of the metal gate.

Some embodiments of the present disclosure provide a semiconductor structure. The semiconductor structure includes a high-k dielectric layer conforming to a bottom and a sidewall of a metal gate; a barrier layer conforming to the high-k dielectric layer; a work function metal layer conforming to the barrier layer and the high-k dielectric layer; and a gate fill metal surrounded by the work function metal layer. The barrier layer proximal to a bottom corner of the metal gate comprises a stair profile.

In some embodiments, a height of the stair profile is of from about 2Å to about 20Å.

In some embodiments, the barrier layer is a bilayer between the work function metal layer and the high-k dielectric layer.

In some embodiments, a thickness of the barrier layer is of from about 2Å to about 40Å.

In some embodiments, a thickness of the work function metal layer is of from about 1Å to about 20Å.

In some embodiments, the work function metal layer comprises aluminum.

In some embodiments, the semiconductor structure is an N-MOSFET or an N-FinFET.

Some embodiments of the present disclosure provide a method for manufacturing a semiconductor structure. The method includes forming a metal gate trench in an interlayer dielectric (ILD); forming a barrier layer in a bottom and a sidewall of the metal gate trench; removing a first portion of the barrier layer at the sidewall of the metal gate trench; forming a work function metal layer, conforming to the barrier layer; and overfilling a gate fill metal to level the gate trench.

In some embodiments, the removing the first portion of the barrier layer at the sidewall of the metal gate trench in the method for manufacturing a semiconductor structure includes filling an etchable material in the metal gate trench; etching back the etchable material to a predetermined height in the metal gate trench to expose the first portion of the barrier layer; removing the first portion of the barrier layer; and removing the remaining etchable material.

In some embodiments, the etchable material filled in the in the metal gate trench is selected from at least one in the group consisting of spin-on glass (SOG), photoresist, oxide, and boro-phospho-silicate-glass (BPSG).

In some embodiments, the etching back the etchable material to the predetermined height in the metal gate trench to expose the first portion of the barrier layer in the method for manufacturing a semiconductor structure includes etching back the etchable material to a height of from about 2Å to about 20Å.

In some embodiments, the removing the first portion of the barrier layer in the method for manufacturing a semiconductor structure includes performing a wet etch operation or a dry etch operation selective between a nitride and an oxide.

In some embodiments, the method for manufacturing a semiconductor structure further includes removing the overfilled gate fill metal and the work function metal layer from a top surface of the ILD.

In some embodiments, the method for manufacturing a semiconductor structure further includes an ion implantation operation after the formation of the work function metal layer.

Moreover, the scope of the present application is not intended to be limited to the particular embodiments of the process, machine, manufacture, and composition of matter, means, methods and steps described in the specification. As those skilled in the art will readily appreciate form the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure.

Accordingly, the appended claims are intended to include within their scope such as processes, machines, manufacture, and compositions of matter, means, methods or steps. In addition, each claim constitutes a separate embodiment, and the combination of various claims and embodiments are within the scope of the disclosure.

What is claimed is:

1. A semiconductor structure, comprising:
   a semiconductor layer having a first surface; and
   an interlayer dielectric (ILD) defining a metal gate over the first surface of the semiconductor layer, wherein the metal gate comprises:
   a high-k dielectric layer conforming to a bottom and a sidewall of the metal gate;
   a barrier layer without aluminum conforming to the high-k dielectric layer, a portion of the high-k dielectric layer at the bottom of the metal gate not being covered by the barrier layer;
   a work function metal layer containing aluminum conforming to the barrier layer and the high-k dielectric layer; and
   a gate fill metal surrounded by the work function metal layer, and wherein the work function metal layer is located between the gate fill metal and the high-k dielectric layer.

2. The semiconductor structure in claim 1, no barrier layer is at the sidewall of the metal gate.

3. The semiconductor structure in claim 1, wherein the barrier layer comprises a bilayer.

4. The semiconductor structure in claim 1, wherein a thickness of the barrier layer is in a range of from about 2 Å to about 40 Å.

5. The semiconductor structure in claim 1, wherein a tail of the work function metal layer, which is the most proximal portion of the work function metal layer with respect to the bottom corner of the metal gate, has a bottom surface in direct contact with the high-k dielectric layer at the bottom of the metal gate.

6. A semiconductor structure, comprising:
a high-k dielectric layer conforming to a bottom and a sidewall of a metal gate;
a barrier layer without aluminum conforming to a bottom of the high-k dielectric layer, a portion of the bottom of the high-k dielectric layer not being covered by the barrier layer;
a work function metal layer containing aluminum conforming to the barrier layer and the high-k dielectric layer, wherein a tail of the work function metal layer, which is the most proximal portion of the work function metal layer with respect to the bottom corner of the metal gate, has a bottom surface in direct contact with the bottom of high-k dielectric layer; and
a gate fill metal surrounded by the work function metal layer.

7. The semiconductor structure in claim 6, wherein the barrier layer is a bilayer between the work function metal layer and the high-k dielectric layer.

8. The semiconductor structure in claim 6, wherein a thickness of the barrier layer is of from about 2 Å to about 40 Å.

9. The semiconductor structure in claim 6, wherein the semiconductor structure is an N-MOSFET or an N-FinFET.

10. A method for manufacturing a semiconductor structure, comprising;
forming a metal gate trench in an interlayer dielectric (ILD);
forming a barrier layer without aluminum in a bottom and a sidewall of the metal gate trench;
removing a sidewall portion of the barrier layer;
forming a work function metal layer containing aluminum, conforming to the barrier layer; and
overfilling a gate fill metal to level the gate trench.

11. The method for manufacturing a semiconductor structure in claim 10, wherein the removing the sidewall portion comprises:
filling an etchable material in the metal gate trench;
etching back the etchable material to at least partially expose the sidewall portion of the barrier layer;
removing the sidewall portion of the barrier layer; and
removing the remaining etchable material.

12. The method for manufacturing a semiconductor structure in claim 10, further comprising removing the overfilled gate fill metal and the work function metal layer from a top surface of the ILD.

13. The method for manufacturing a semiconductor structure in claim 10, further comprising an ion implantation operation after the formation of the work function metal layer.

14. The method for manufacturing a semiconductor structure in claim 13, wherein the ion implantation operation comprises implanting aluminum into the work function metal layer.

15. The method for manufacturing a semiconductor structure in claim 11, wherein the etchable material is selected from at least one in the group consisting of spin-on glass (SOG), photoresist, oxide, and boro-phospho-silicate-glass (BPSG).

16. The method for manufacturing a semiconductor structure in claim 11, wherein the removing the sidewall portion of the barrier layer comprises performing a wet etch operation or a dry etch operation selective between a nitride and an oxide.

17. The method for manufacturing a semiconductor structure in claim 11, wherein the removing a sidewall portion of the barrier layer comprises an over-etch operation.

18. The method for manufacturing a semiconductor structure in claim 17, wherein the over-etch operation removes the sidewall portion of the barrier layer until a sidewall of the etchable material is exposed.

19. The method for manufacturing a semiconductor structure in claim 17, wherein the over-etch operation removes the sidewall portion of the barrier layer until a portion of the bottom of the metal gate trench is exposed.

* * * * *